(12) United States Patent  
Iraha et al.

(10) Patent No.: US 8,629,709 B2
(45) Date of Patent: Jan. 14, 2014

(54) HIGH FREQUENCY SWITCH CIRCUIT DEVICE

(75) Inventors: Tomoyuki Iraha, Kanagawa (JP); Tatsuhiko Maruyama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/175,004

(22) Filed: Jul. 1, 2011

(65) Prior Publication Data

US 2012/0001676 A1 Jan. 5, 2012

(30) Foreign Application Priority Data

Jul. 2, 2010 (JP) .................................. 2010-152361
Jul. 22, 2010 (JP) .................................. 2010-165262
Feb. 9, 2011 (JP) .................................. 2011-025985

(51) Int. Cl.
*H03K 17/687* (2006.01)
*H03K 3/00* (2006.01)
*H03K 5/08* (2006.01)
*H03K 17/04* (2006.01)
*H03B 1/00* (2006.01)
*H03L 5/00* (2006.01)

(52) U.S. Cl.
USPC ........... 327/427; 327/108; 327/109; 327/110; 327/111; 327/112; 327/312; 327/374; 327/375; 327/376; 327/377

(58) Field of Classification Search
USPC ......... 327/108–112, 312, 374–377, 412, 199, 327/200, 208–210, 215–218; 455/73, 78
See application file for complete search history.

(56) References Cited

U.S. PATENT DOCUMENTS

| 5,689,209 A * | 11/1997 | Williams et al. ............... 327/425 |
| 7,910,993 B2 | 3/2011 | Brindle et al. |
| 8,058,922 B2 * | 11/2011 | Cassia ............................ 327/534 |
| 8,170,500 B2 * | 5/2012 | Seshita et al. .................... 455/78 |
| 2009/0023415 A1 | 1/2009 | Seshita |

FOREIGN PATENT DOCUMENTS

| JP | 2002-25267 A | 1/2002 |
| JP | 2009-500868 A | 1/2009 |
| JP | 2009-27487 A | 2/2009 |
| JP | 2009-158671 A | 7/2009 |

* cited by examiner

*Primary Examiner* — Temesgh Ghebretinsae
*Assistant Examiner* — Devan Sandiford
(74) *Attorney, Agent, or Firm* — Foley & Lardner LLP

(57) ABSTRACT

A switch circuit device includes a switch circuitry and a driver circuitry. The switch circuitry switches an electrical connection between first and second terminals between the on-state and the off-state in response to a set of control signals. The driver circuitry is configured to generate the control signals and includes an N-latch circuit and a leakage current suppression circuitry. The N-latch circuit selectively outputs lower one of two input voltages fed thereto as one of the control signals. The leakage current suppression circuitry suppresses the leakage current through the N-latch circuit.

13 Claims, 19 Drawing Sheets

HIGH FREQUENCY SWITCH CIRCUIT DEVICE

INCORPORATION BY REFERENCE

This application claims the benefit of priority based on Japanese Patent Application No. 2010-152361 filed on Jul. 2, 2010, and Japanese Patent Application No. 2010-165262 filed on Jul. 22, 2010, and Japanese Patent Application No. 2011-025985 filed on Feb. 9, 2011, the disclosures of which are incorporated herein by reference.

BACKGROUND

The present invention relates to a switch circuit device and a switch control method using the same, more particularly, to a switch circuit device which handles a high-frequency signal and a switch control method using the same.

High-frequency switch circuit devices are used for switching operations of cell phones between the transmitting operation and the receiving operation. In cell phones, there is a need for handling a signal of a large voltage amplitude without distortion. Accordingly, as disclosed in Japanese Patent Application Publication No. 2009-27487 A, a negative voltage is used as a control voltage of a switch circuit device.

The high-frequency semiconductor switch device disclosed in this patent document includes a high-frequency switch circuit, a negative voltage generator circuit and a control circuit, which are monolithically integrated in the same semiconductor substrate. Here, the high-frequency circuit switches a connection between a plurality of terminals. The control circuit is connected to the high-frequency switch circuit and the negative voltage generator circuit and feeds a control signal to the high-frequency switch circuit. The control circuit includes a level shift circuit, a diode and a transistor. The level shift circuit has a low-side power supply terminal connected to the negative voltage generator circuit and an output node connected to the high-frequency switch circuit. The level shift circuit is configured to generate the control signal fed to the high-frequency so that the low level of the control signal has a negative voltage level. The diode has an anode connected to the output node of the level shift circuit. The transistor has a drain and a source connected to the cathode of the diode and the ground, respectively. The drain and source of the transistor are switched from the off-state to the on-state before the voltage level of the output node of the level shift circuit is switched from the high level to the low level.

FIG. 1 is a circuit diagram schematically showing an exemplary configuration of a SPDT (single pole double throw) circuit device, which is one example of the high-frequency switch device. The SPDT circuit device shown in FIG. 1 includes an antenna terminal, a first port 1, a second port 2, a first switch circuitry 10a, a second switch circuitry 10b, a first driver circuit 201, a second driver circuit 200, a decoder circuit 202 and a control signal input terminal.

The first switch circuitry 10a is disposed between the antenna terminal and the first port 1. Similarly, the second switch circuitry 10b is disposed between the antenna terminal and the second port 2. The control signal input terminal is connected to the input of the decoder 202. The first output 202a of the decoder circuit 202 is connected to the input of the first driver circuit 201. The outputs of the first driver circuit 201 are connected to control signal inputs of the first switch circuitry 10a. The second output 202b of the decoder circuit 202 is connected to the input of the second driver circuit 202. The outputs of the second driver circuit 200 are connected to control signal inputs of the second switch circuitry 10b.

In the following, a description is given of the operation of the SPDT circuit device shown in FIG. 1.

FIG. 1 shows one example in which the first switch circuitry 10a is in the on-state and the second switch circuitry 10b is in the off-state.

A first gate-side terminal G1 of the switch circuitry 10a is fed with a positive voltage VDD, and a first back-gate-side terminal BG1 is fed with the ground voltage GND. This results in that the serially-connected N-type MOS transistors 101 to 103 are each placed into the on-state between the source and drain thereof. It should be noted that the on-resistances of the N-type MOS transistors 101 to 103 cause insertion loss. To address this problem, the positive voltage VDD fed to the first gate-side terminal G1 is adjusted to the allowed maximum voltage at which reliability assurance of the N-type MOS transistors 101 to 103 is achieved.

On the other hand, a second gate-side terminal G2 and a second back-gate-side terminal BG2 are commonly fed with a negative voltage VSS. This results in that the serially-connected MOS transistors 104 to 106 are each placed into the off-state between the source and drain thereof. It is necessary that the N-type MOS transistors 104 to 106 be kept in the off-state even when a large-amplitude signal is fed to the antenna terminal and the first port 1. To address this problem, the negative voltage VSS fed to the second gate-side terminal G2 and the second back-gate-side terminal BG2 is adjusted to the allowed minimum voltage at which reliability assurance of the N-type MOS transistors 104 to 106 is achieved.

FIG. 2 is a circuit diagram schematically showing the configurations of the first and second driver circuits 201 and 200. The first driver circuit 201 includes a first level conversion circuit 203a and a first output circuit 204a. The second driver circuit 200 includes a second level conversion circuit 203b and a second output circuit 204b. The control signal input is connected to the input of the decoder 202. The first output 202a of the decoder 202 is connected to the input of the first level conversion circuit 203a. The output of the first level conversion circuit 203a is connected to the input of the first output circuit 204a. The second output 202b of the decoder circuit 202 is connected to the input of the second level conversion circuit 203b. The output of the second level conversion circuit 203b is connected to the input of the second output circuit 204b.

In the following, a description is given of the operations of the decoder circuit 202 and the first and second driver circuits 201 and 200 shown in FIG. 2. First, the decoder circuit 202 externally receives a control signal on the control signal input. The decoder circuit 202 generates a control signal for controlling the N-type MOS transistors 101 to 103 of the first switch circuit 10a, in response to the received control signal. The generated control signal is subjected to the voltage level conversion by the first level conversion circuit 203a and then outputted by the first output circuit 204a as voltages to be applied to the gates and back-gates of the N-type MOS transistors 101 to 103 of the first switch circuitry 10a. The second driver circuit 200 operates in the same way and outputs voltages to be applied to the gates and back-gates of the N-type MOS transistors 104 to 106 of the second switch circuitry 10b.

FIG. 3 is a circuit diagram schematically showing an example of the configurations of the output circuits 204a and 204b. The output circuits 204a and 204b each include an input IN, an inverter circuit, an N-latch circuit, a first (or second) gate-side terminal G1 (or G2) and a first (or second) back-gate-side terminal BG1 (or BG2). The inverter circuit includes a P-type MOS transistor MP1 and an N-type MOS transistor MN1. The N-latch circuit includes N-type MOS transistors MN2 and MN3.

In the following, a description is given of the operations of the output circuits 204a and 204b. The inverter circuit outputs the negative voltage VSS from the first (or second) gate-side terminal G1 (or G2) when the voltage level at the input IN is high (for example, the positive voltage VDD) and outputs the positive voltage VDD when the voltage level at the input IN is low (for example, the negative voltage VSS). The N-latch circuit outputs lower one of two input voltages fed thereto, as understood from Japanese Patent Application Publication No. 2002-25267 A. In the configuration of FIG. 3, the N-latch circuit receives the output voltage of the inverter circuit and the ground voltage, and outputs lower one of the two voltages from the first (or second) back-gate-side terminal BG1 (or BG2).

Table 1 shows the voltages at the respective terminals of the output circuits 204a and 204b shown in FIG. 3 for the setting of the switch circuitries 10a and 10b. As shown in Table 1, when one switch circuitry (10a or 10b) is in the on-state, the gates of the N-type transistors of the switch circuitry (that is, the gate-side terminal G1 or G2) are fed with the positive voltage VDD, and the back-gates (that is, the back-gate-side terminal BG1 or BG2) are fed with the ground voltage GND. When one switch circuitry (10a or 10b) is in the off-state, on the other hand, the gates of the N-type transistors of the switch circuitry are fed with the negative voltage VSS, and the back-gates (that is, the back-gate-side terminal BG1 or BG2) are also fed with the negative voltage VSS.

TABLE 1

| SW SETTING | IN | G1 (Gate) | BG1 (Back Gate) |
| --- | --- | --- | --- |
| ON-STATE | VSS | VDD | GND |
| OFF-STATE | VDD | VSS | VSS |

In association with the above-described art, Japanese Patent Application Publication No. 2009-158671 A discloses a high-frequency switch. The disclosed high-frequency switch includes n semiconductor transistors having sources and drains connected between a plurality of terminals which interface a high frequency signal. The disclosed high-frequency switch is configured such that Voff is set to a value between Vf and (Vth−Vpin/n) where Voff is a voltage which places the semiconductor transistors into the off-state when fed to the gates thereof, Vth is the threshold voltage of the semiconductor transistors, Vf is the flat band voltage of the semiconductor transistors, and Vpin is the maximum amplitude of the high-frequency signal fed to the terminals.

Japanese Patent Application Publication No. 2009-500868 discloses an ACC (accumulated charge control) floating body MOSFET. The disclosed ACC MOSFET is adapted to control the nonlinear response of the MOSFET when the MOSFET is operated in an accumulated charge regime. The disclosed ACC MOSFET includes a MOSFET and an accumulated charge sink (ACS). The MOSFET has a floating body, wherein the floating body MOSFET selectively operates in the accumulated charge regime, and wherein accumulated charges are present in the body of the floating body MOSFET when the MOSFET operates in the accumulated charge regime. The accumulated charge sink (ACS) is operatively coupled to the body of the MOSFET, wherein the ACS removes or controls the accumulated charges in the MOSFET body.

The above-described driver circuits 201 and 200 suffer from a problem of increased power consumption caused by generation of a leakage current within the driver circuits when a large-amplitude high-frequency signal is inputted between the antenna terminal and the first port 1 or the second port 2.

FIG. 4 is an equivalent circuit diagram schematically showing the configurations and operations of the output circuit 204a and the switch circuitry 10a. The configuration of the output circuit 204a is already described with reference to FIG. 3. The N-type MOS transistor 120, which is shown as being connected to the output circuit 204a in FIG. 4, schematically represents the N-type MOS transistors 101 to 103 of the switch circuitry 10a shown in FIG. 1. The resistor 121 of FIG. 4 schematically represents the transistors 107 to 109 of FIG. 1, and the transistor 119 of FIG. 4 schematically represents the resistors 113 to 115. The N-type MOS transistor 120 is shown as having a gate connected to the gate-side terminal G1 through the resistor 121, a back-gate connected to the back-gate-side terminal BG1 through the resistor 119, and a source and drain connected to the antenna terminal and the port which is set to the on-state. There are parasitic capacitances between the source and the back gate of the N-type MOS transistor 120 and between the drain and the back-gate.

When the switch circuit 10a is placed in the on-state, the voltage outputted from the gate-side output of the output circuit 204a is VDD and the voltage outputted from the back-gate-side output is GND, as is described in the explanation of FIG. 3 and Table 1. Here, a leakage current through the N-latch circuit of the output circuit 204a is generated due to a portion of the signal transmitted between the antenna circuit and the switch circuitry 10a, which is placed into the on-state. As a result, superposition of a high-frequency signal occurs in the output circuit 204a.

FIG. 5 is a circuit diagram showing an equivalent circuit of the output circuit 204a of FIG. 4 and the route of the leak current. The equivalent circuit diagram shown in FIG. 5 is obtained by replacing the N-type MOS transistor MN3 of the circuit shown in FIG. 3 with a resistor. It should be noted that the equivalent circuit of FIG. 5 stands under conditions in which the input voltage is VSS (a negative voltage) and the switch MOS transistors to be controlled are set to the on-state.

The voltage at the back-gate side output BG1 of the output circuit 204a instantaneously becomes positive or negative due to the superposition of the high frequency signal. When the voltage at the back-gate side output BG1 is positive, the gate-to-source Vgs of the N-type MOS transistor MN2 is negative and the N-type MOS transistor MN2 is kept in the off-state. When the voltage at the back-gate side output BG1 of the output circuit 204a is negative, however, the gate-to-source voltage Vgs of the N-type MOS transistor MN2 is positive and the N-type MOS transistor MN2 is placed into the on-state or into a state in which the N-type MOS transistor MN2 operates in the sub-threshold region. In this case, as shown in FIG. 5, a leakage current is generated which passes a route from the supply line of the positive voltage VDD to the ground via the P-type MOS transistor MP1 of the inverter circuit, the N-type MOS transistors MN2 and MN3 of the N-latch circuit.

FIG. 6 is a waveform diagram showing the waveform of the leakage current caused by the superposition of the high-frequency signal via the output circuit shown in FIG. 3. In the waveform diagram of FIG. 6, the broken line indicates the time-dependent changes in the high-frequency signal and the solid line indicates the time-dependent changes in the leakage current. As is understood from FIG. 6, the output circuit shown in FIG. 3 performs half-wave rectification in which a current flows from the supply line of the positive power supply voltage VDD to the ground for half of each period of the high-frequency signal.

FIG. 7 is a waveform diagram showing the gate-to-source voltage Vgs of the N-type MOS transistor MN2 for a case when a large-amplitude signal is fed to the antenna terminal in the output circuit shown in FIG. 3. FIG. 8 is a waveform diagram showing the current flowing through the N-type MOS transistor MN2 for a case when a large-amplitude signal is fed to the antenna terminal in the output circuit 204a shown in FIG. 3. As is understood from FIGS. 7 and 8, a large current flows for half of each period.

FIG. 9 is a graph showing a comparison of results of numerical simulations of the relation between the input signal power into the antenna terminal and the current consumption. In FIG. 9, the vertical axis represents the input signal power into the antenna terminal and the horizontal axis represents the current consumption of the circuit. The solid line indicates the current consumption of the output circuit shown in FIG. 3, and the broken line indicates that of one embodiment of the present invention, which is described later. As is understood from FIG. 9, the output circuit of FIG. 3 exhibits an increase in the current consumption as the increase in the signal power inputted to the antenna terminal.

SUMMARY

In an aspect of the present invention, a switch circuit device includes a switch circuitry and a driver circuitry. The switch circuitry switches an electrical connection between first and second terminals between the on-state and the off-state in response to a set of control signals. The driver circuitry is configured to generate the control signals and includes an N-latch circuit and a leakage current suppression circuitry. The N-latch circuit selectively outputs lower one of two input voltages fed thereto as one of the control signals. The leakage current suppression circuitry suppresses the leakage current through the N-latch circuit.

In another aspect of the present invention, a switch control method includes:

generating a set of control signals; and switching an electrical connected between first and second terminals between an on-state and an off-state in response to the set of generated control signals. The generating includes: outputting lower one of two input voltages by using an N-latch circuit as one of the set of control signals; and suppressing a leakage current through the N-latch circuit.

In the switch circuit device of the present invention, the leakage current suppression circuitry effectively solves the problem of the leakage current through the N-latch circuit.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
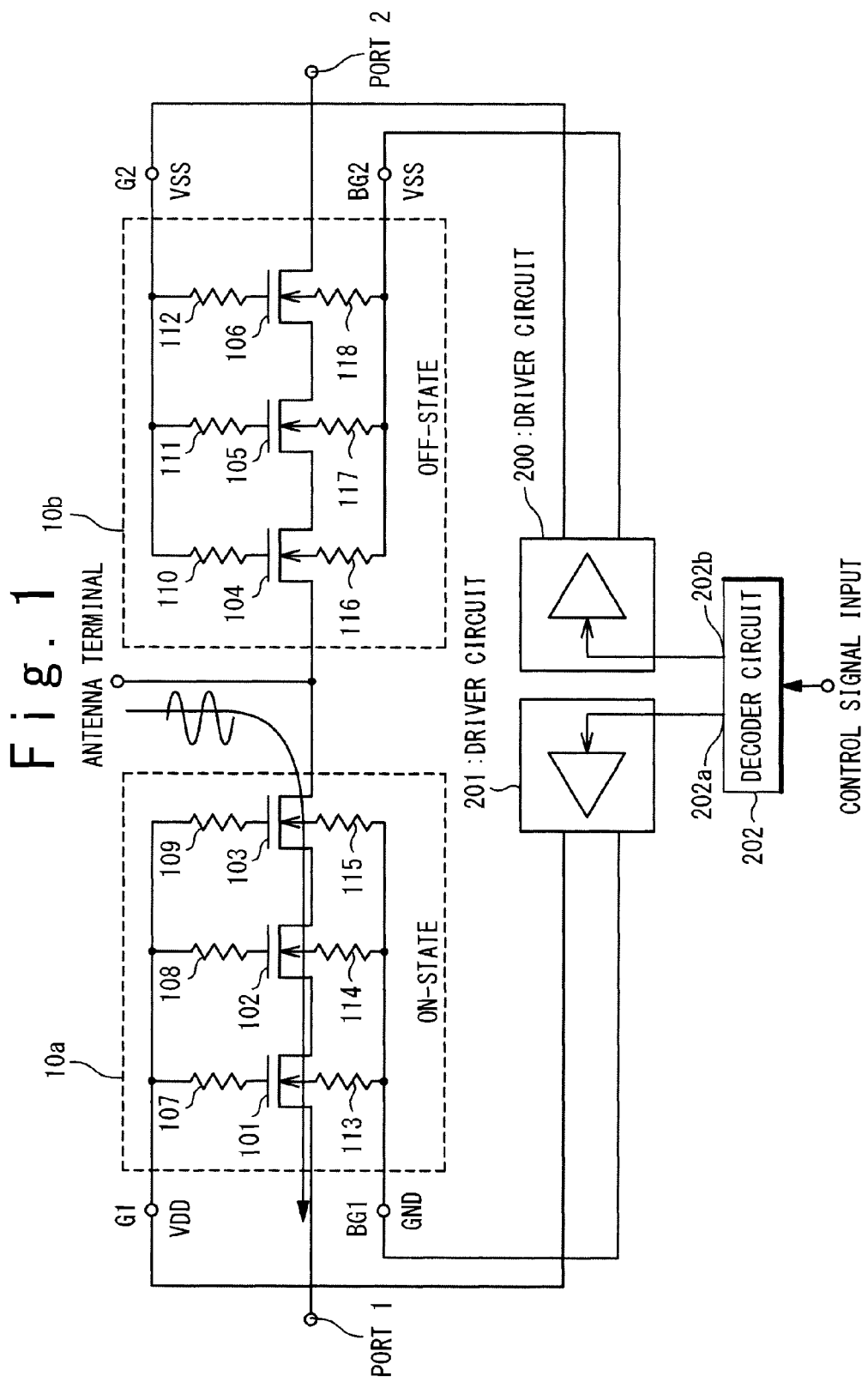
FIG. 1 is a circuit diagram showing an exemplary configuration of a SPDT circuit device, which is one example of a high-frequency switch circuit device.

FIG. 1 is a circuit diagram schematically showing a SPDT circuit device, which is one example of high-frequency switch circuit devices. Hereinafter, a detailed description is given of the configuration of the circuit shown in FIG. 1, although the circuit configuration is already roughly described in the "Background" section.

The switch circuit device shown in FIG. 1 includes a control signal input terminal, a decoder circuit 202, a first driver circuit 201, a second driver circuit 200, a first switch circuitry 10a, a second switch circuitry 10b, a first port 1, a second port 2 and an antenna terminal. The first switch circuitry 10a includes three N-type MOS transistors 101 to 103 and six resistors 107 to 109 and 113 to 115. The second switch circuitry 10b includes three N-type MOS transistors 104 to 106 and six resistors 110 to 112 and 116 to 118. It should be noted that, although FIG. 1 shows that the switch circuit device includes two switch circuitries 10a and 10b, this configuration is merely one example and the number of switch circuitries is not limited to two in this invention. In the same way, it should be noted that, although FIG. 1 shows that each of the switch circuitries 10a and 10b includes three N-type MOS transistors and six resistors, this configuration is merely one example and the numbers of the N-type MOS transistors and the resistors are not limited to three and six, respectively, in this invention.

The connections among the components of the switch circuit apparatus of FIG. 1 are as follows: The control signal input terminal is connected to the input of the decoder circuit 202. The first output 202a of the decoder 202 is connected to the input of the first driver circuit 201. The second output 202b of the decoder 202 is connected to the input of the second driver circuit 200. The outputs of the first driver circuit 201 are connected to the first gate-side terminal G1 and the first back-gate-side terminal BG1. The output of the second driver circuit 200 is connected to the second gate-side terminal G2 and the second back-gate-side terminal BG2. The first switch circuitry 10a is connected to the antenna terminal and the first port 1. The second switch circuitry 10b is connected to the antenna terminal and the second port 2.

The first port 1 is connected to the source of the N-type MOS transistor 101 of the first switch circuitry 10a. The drain of the N-type MOS transistor 101 is connected to the source of the N-type MOS transistor 102. The drain of the N-type MOS transistor 102 is connected to the source of the N-type MOS transistor 103. The drain of the N-type MOS transistor 103 is connected to the antenna terminal. It should be noted the source and drain of each of the N-type MOS transistors 101 to 103 may be mutually exchanged.

The first switch circuitry 10a is connected to the output of the first driver circuit 201 through the first gate-side terminal G1 and the first back-gate-side terminal BG1. The first gate-side terminal G1 is connected to the first terminals of the respective resistors 107, 108 and 109. The second terminals of the resistors 107, 108 and 109 are connected to the gates of the respective N-type MOS transistors 101, 102 and 103. The back-gates of the N-type MOS transistors 101, 102 and 103 are connected to the first terminals of the respective resistors 113, 114 and 115. The second terminals of the respective resistors 113, 114 and 115 are connected to the first back-gate-side terminal BG1.

The second port 2 is connected to the source of the N-type MOS transistor 106 of the second switch circuitry 10b. The drain of the N-type MOS transistor 106 is connected to the source of the N-type MOS transistor 105. The drain of the N-type MOS transistor 105 is connected to the source of the N-type MOS transistor 104. The drain of the N-type MOS transistor 104 is connected to the antenna terminal. It should be noted the source and drain of each of the N-type MOS transistors 104 to 106 may be mutually exchanged.

The second switch circuitry 10b is connected to the outputs of the second driver circuit 200 through the second gate-side terminal G2 and the second back-gate-side terminal BG2. The second gate-side terminal G2 is connected to the first terminals of the respective resistors 110, 111 and 112. The second terminals of the resistors 110, 111 and 112 are connected to the gates of the N-type MOS transistors 104, 105 and 106, respectively. The back-gates of the N-type MOS transistors 104, 105 and 106 are connected to the first terminals of the resistors 116, 117 and 118. The second terminal of the respective resistors 116, 117 and 118 are connected to the second back-gate-side terminal BG2.

Referring to FIG. 1, a description is given of an exemplary overall operation of the switch circuit device according to the first embodiment of the present invention. The decoder circuit 202 receives a control signal on the control signal input terminal and generates a pair of control signals used for controlling the first and second driver circuits 201 and 200 in response to the received control signal. The first and second driver circuits 201 and 202 generate first and second control signal pairs used for controlling the first and second switch circuitry 10a and 10b, respectively, in response to the control signals generated by the decoder circuit 202. The first switch circuitry 10a switches the electrical connection between the antenna terminal and the first port 1 between the on-state and the off-state, in response to the first control signal pair. In the same way, the second switch circuitry 10b switches the electrical connection between the antenna terminal and the second port 2 between the on-state and the off-state, in response to the second control signal pair.

Referring to FIG. 1 again, a description is given of an exemplary operation of the first and second switch circuitries 10a and 10b according to the first embodiment of the present invention. The first control signal pair includes a first gate control signal fed to the first gate-side terminal G1 and a first back-gate control signal fed to the first back-gate-side terminal BG1. In FIG. 1, the first gate-side terminal G1 is fed with the positive voltage VDD and the first back-gate-side terminal BG1 is fed with the ground voltage GND. Accordingly, the gates of the N-type MOS transistor 101 to 103 are fed with the positive voltage VDD via the resistors 107 to 109. Also, the back-gates of the N-type MOS transistor 101 to 103 are fed with the ground voltage GND via the resistors 113 to 115. In this case, the N-type MOS transistors 101 to 103 are each placed in the on-state between the source and drain thereof and the antenna terminal and the first port 1 are electrically connected. In other words, the first switch circuitry 10a is placed in the on-state.

Similarly, the second control signal pair includes a second gate control signal fed to the second gate-side terminal G2 and a second back-gate control signal fed to the second back-gate-side terminal BG2. In FIG. 1, the second gate-side terminal G2 and the second back-gate-side terminal BG2 are both fed with the negative voltage VSS. Accordingly, the gates of the N-type MOS transistors 104 to 106 are fed with the negative voltage VSS through the resistors 110 to 112. Also, the back-gates of the N-type MOS transistors 104 to 106 are fed with the negative voltage VSS through the resistor 116 to 118. In this case, the N-type MOS transistors 104 to 106 are each placed in the off-state between the source and drain thereof and the antenna terminal and the second port 2 are electrically disconnected. In other words, the second switch circuitry 10b is placed in the off-state.

Figure 2:
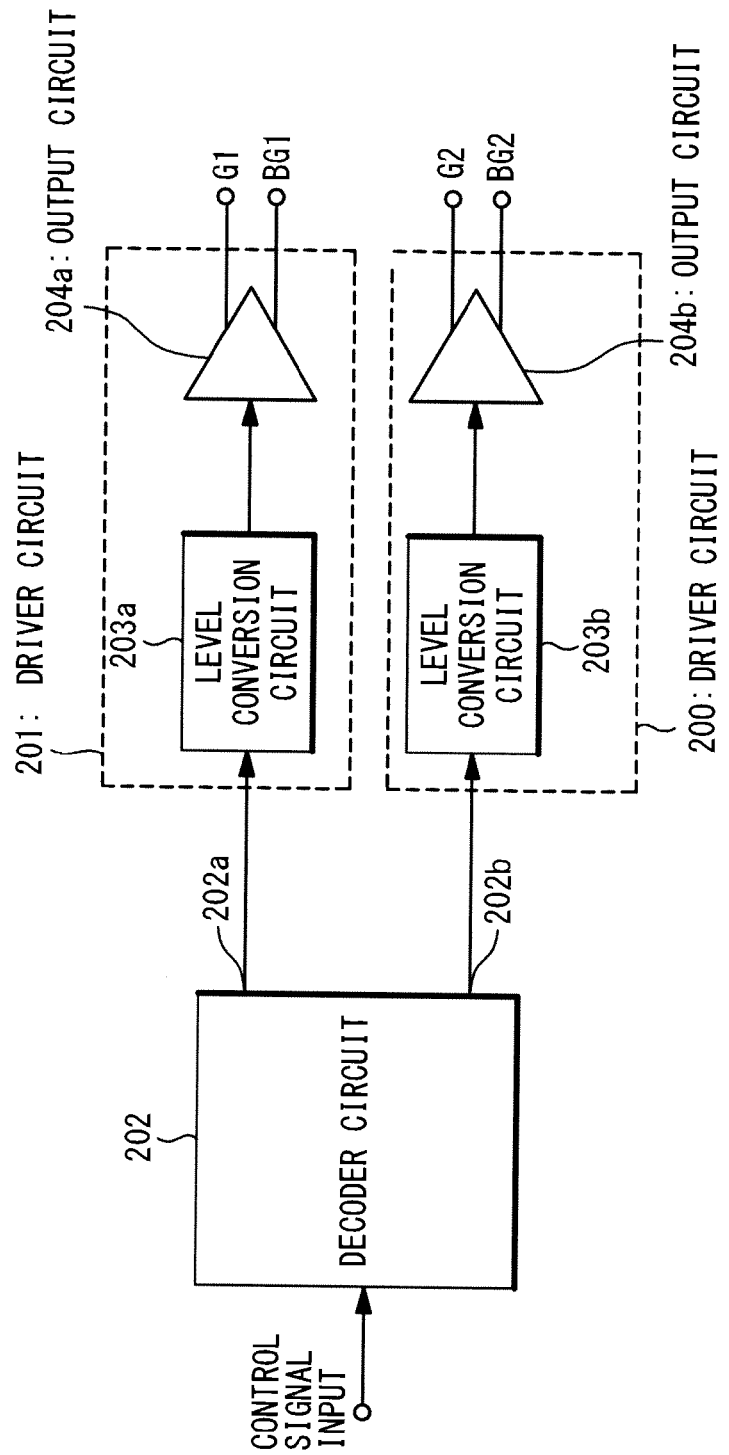
FIG. 2 is a circuit diagram schematically showing the configurations of first and second driver circuits.

FIG. 2 is a circuit diagram schematically showing the configurations of the first and second driver circuits 201 and 200. A detailed description is given of the circuit configuration of the circuit shown in FIG. 2, although the circuit configuration is already roughly described in the "background" section.

As shown in FIG. 2, the first driver circuit 201 includes a first level conversion circuit 203a and a first output circuit 204a. The second driver circuit 200 includes a second level conversion circuit 203b and a second output circuit 204b.

As described with reference to FIG. 1, the control signal input is connected to the input of the decoder 202. The first output 202a of the decoder 202 is connected to the input of the first level conversion circuit 203a. The output of the first level conversion circuit 203a is connected to the input of the first output circuit 204a. The two outputs of the first output circuit 204a are connected to the first gate-side terminal G1 and the first back-gate-side terminal BG1, respectively. The second output 202b of the decoder 202 is connected to the input of the second level conversion circuit 203b. The output of the second level conversion circuit 203b is connected to the input of the second output circuit 204b. The two outputs of the second output circuit 204b are connected to the second gate-side terminal G2 and the second back-gate-side terminal BG2.

Referring to FIG. 2, a description is given of an exemplary operation of the first driver circuit 201. The first level conversion circuit 203a converts the voltage level of a first control signal generated by the decoder 202 to that adapted to the first output circuit 204a. The first output circuit 204a generates the first gate control signal and the first back-gate control signal in response to the level-converted control signal and feeds the first gate control signal and the first back-gate control signal to the first gate-side terminal G1 and the first back-gate-side terminal BG1. In the same way, the second level conversion circuit 203b converts the voltage level of a second control signal generated by the decoder 202 to that adapted to the second output circuit 204b. The second output circuit 204b generates the second gate control signal and the second back-gate control signal in response to the level-converted control signal and feeds the second gate control signal and the second back-gate control signal to the second gate-side terminal G2 and the second back-gate-side terminal BG2.

Figure 10:
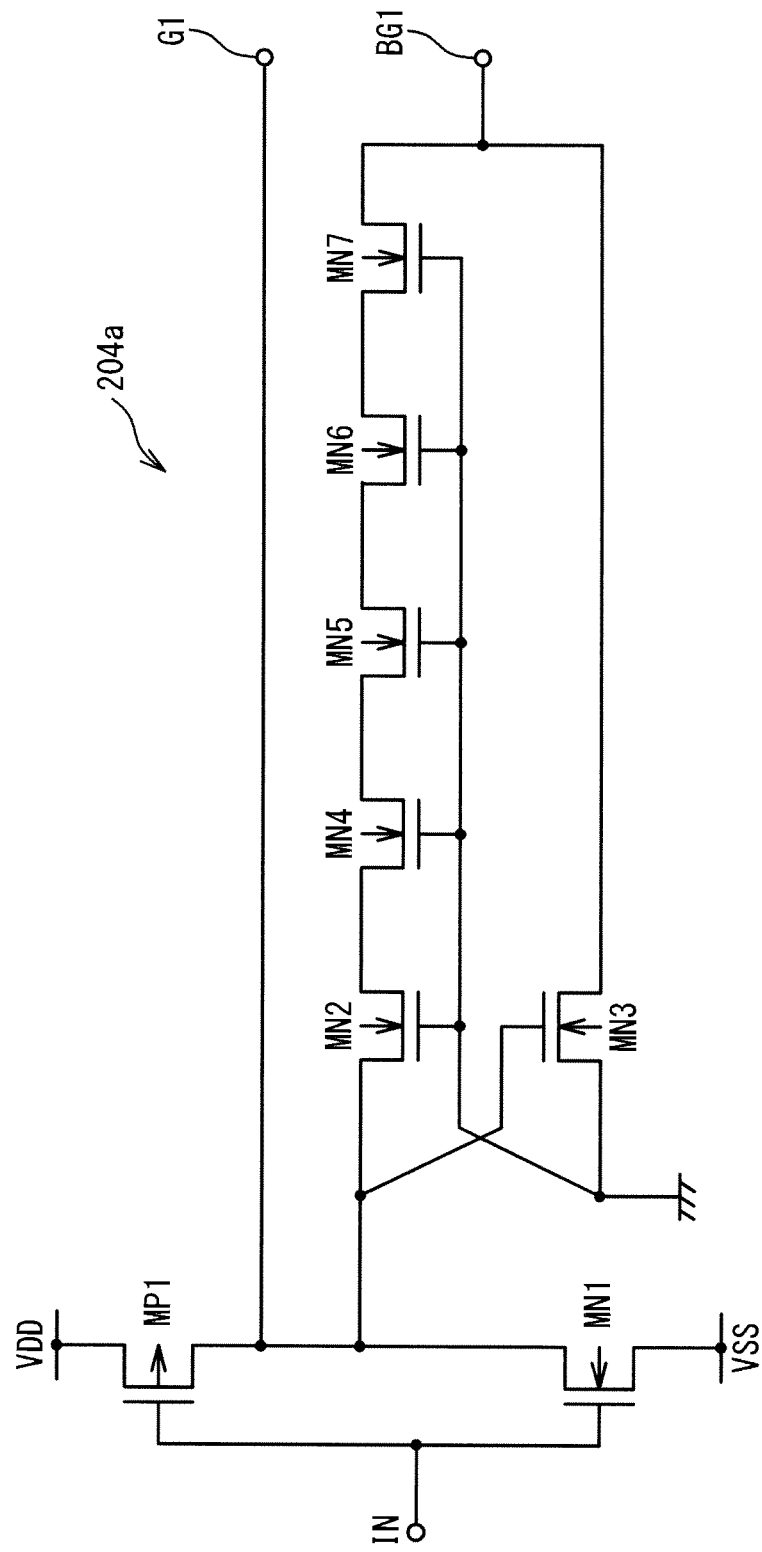
FIG. 10 is a circuit diagram showing an exemplary configuration of a first output circuit incorporated in a switch circuit device according to a first embodiment of the present invention.

FIG. 10 is a circuit diagram showing an exemplary configuration of the first output circuit 204a according to the first embodiment of the present invention.

The first output circuit 204a includes an inverter circuit, an N-latch circuit and a low pass filter circuit.

In the following, a description is given of the components of the first output circuit 204a shown in FIG. 10. The inverter circuit includes a P-type MOS transistor MP1 and an N-type MOS transistor MN1. The N-latch circuit includes two N-type MOS transistors MN2 and MN3. The low pass filter circuit includes four N-type MOS transistors MN4 to MN7. Although FIG. 10 shows that the low pass filter circuit includes four N-type MOS transistors MN4 to MN7, this configuration is merely one example; the number of the N-type transistors of the low pass filter circuit is not limited to four in the present invention.

In the following, a description is given of the connections among the components of the first output circuit 204a shown in FIG. 10. The input IN of the first output circuit 204a is connected to the gates of the P-type MOS transistor MP1 and the N-type MOS transistor MN1. The source of the P-type MOS transistor MP1 is connected to the supply line of the positive power supply voltage VDD. The drain of the P-type MOS transistors MP1 is connected to the first gate-side terminal G1, the drain of the N-type MOS transistor MN1, the drain of the N-type MOS transistor MN2, and the gate of the N-type MOS transistor MN3. The source of the N-type MOS transistor MN1 is connected to the supply line of the negative power supply voltage VSS. The gate of the N-type MOS transistor MN2 is connected to the ground, the drain of the N-type MOS transistor MN3 and the gates of the N-type MOS transistors MN4 to MN7. The source of the N-type MOS transistor MN2 is connected to the drain of the N-type MOS transistor MN4. The source of the N-type MOS transistor MN3 is connected to the first back-gate-side terminal BG1 and the source of the N-type MOS transistor MN7. The source of the N-type MOS transistor MN4 is connected to the drain of the NMOS transistor MN5. The source of the N-type MOS transistor MN5 is connected to the drain of the N-type MOS transistor MN6. The source of the N-type MOS transistor MN6 is connected to the drain of the N-type MOS transistor MN7.

It should be noted that the source and drain may be mutually exchanged in each of the P-type MOS transistor MP1 and the N-type MOS transistors MN1 to MN7.

Referring to FIG. 10, a description is given of an exemplary operation of the first output circuit 204a according to the first embodiment of the present invention.

In the first output circuit 204a shown in FIG. 10, the inverter circuit outputs an output voltage selected from the power supply voltages VDD and VSS in response to the voltage applied to the input IN, so that the polarity of the output voltage is opposite to that of the voltage applied to the input IN. In other words, the inverter circuit outputs the negative power supply voltage VSS when the voltage applied to the input IN is positive and outputs the positive power supply voltage VDD when the voltage applied to the input IN is negative. The output voltage of the inverter circuit is fed to the first gate-side terminal G1 as the first gate control signal and is also used as a first input voltage of the N-latch circuit.

In the first output circuit 204a shown in FIG. 10, the N-latch circuit receives the output voltage of the inverter circuit as the first input voltage and the ground voltage GND as a second input voltage. The N-latch circuit outputs lower one of the two input voltages to the back-gate-side terminal as the first back-gate control signal.

In the first output circuit 204a shown in FIG. 10, the low pass filter circuit suppresses the high-frequency signal transmitting from the first back-gate-side terminal BG1 to the NMOS transistor MN2 while allowing the dc voltage to be outputted from the N-type MOS transistor MN2 to the first back-gate-side terminal BG1 without attenuation.

The configuration and operation of the second output circuit 204b are same as those of the first output circuit 204a and no detailed description is given of the second output circuit 204b.

Referring to Table 1 again, a description is given of the voltages at the respective terminals in the first output circuit 204a which depend on the switch setting of the switch circuitry 10a, although the voltages at the respective terminals in the first output circuit 204a are already briefly described in the "background" section. As shown in Table 1, in order to place the switch circuitry 10a into the on-state, the gates of the N-type MOS transistors 101 to 103 are fed with the positive power supply voltage VDD and the back-gates are fed with the ground voltage GND. In order to place the switch circuitry 10a into the off-state, on the other hand, the gates of the N-type MOS transistors 101 to 103 are fed with the negative power supply voltage VSS and the back-gates are also fed with the negative power supply voltage VSS.

Figure 11:
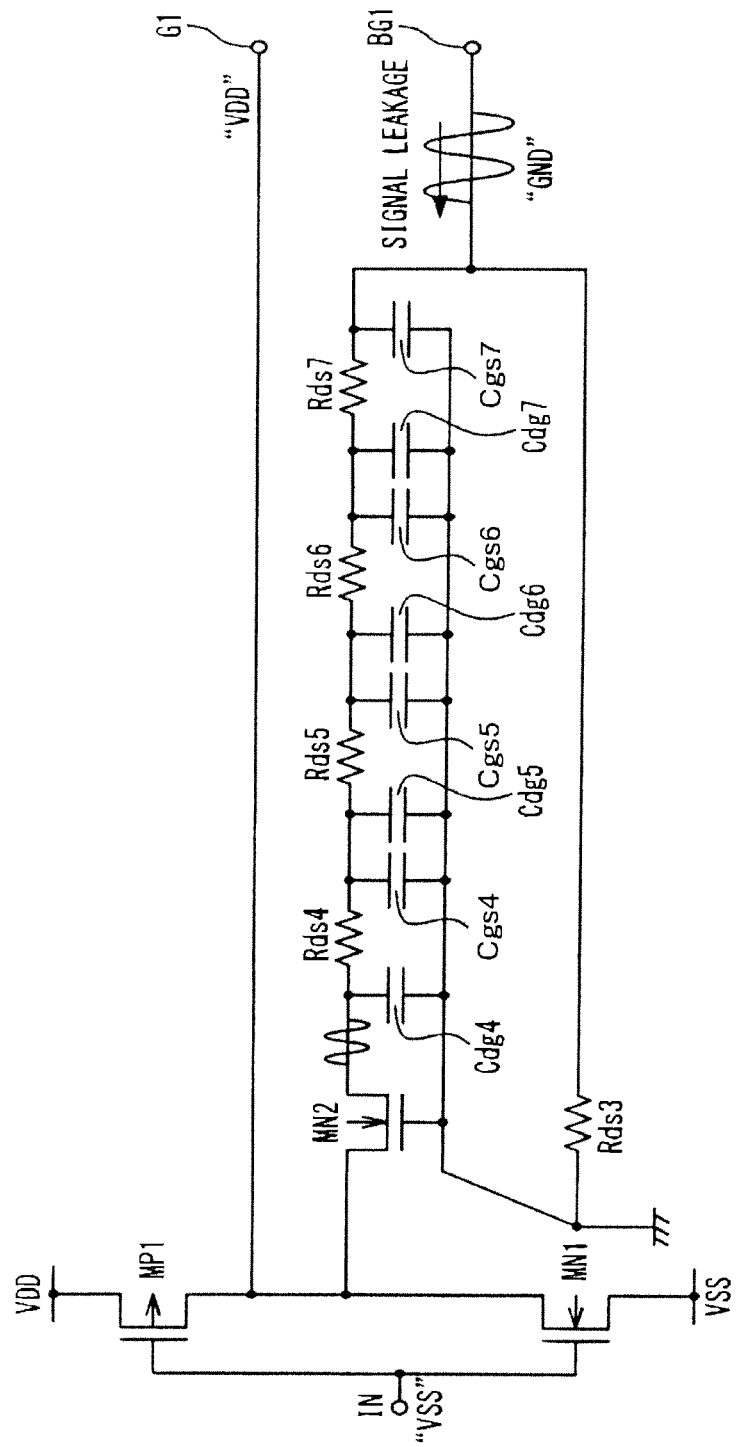
FIG. 11 is a circuit diagram showing an equivalent circuit of the output circuit shown in FIG. 10.

FIG. 11 is a circuit diagram showing an equivalent circuit of the output circuit 204a shown in FIG. 10. When the negative power supply voltage VSS is applied to the input IN as shown in FIG. 11, the N-type MOS transistor MN3 shown in FIG. 10 is equivalent to a resistor disposed between the source and drain thereof. The N-type MOS transistors MN4 to MN7 shown in FIG. 10 are each equivalent to a resistor disposed between the source and drain thereof, a capacitor disposed between the source and gate thereof and a capacitor disposed between the drain and gate thereof.

As shown in FIG. 11, the equivalent circuit of the output circuit 204a is obtained by the following modifications: The N-type MOS transistor MN3 is replaced with a resistor Rds3 connected between the ground and the first back-gate-side terminal BG1. The N-type MOS transistors MN4 to MN7 are replaced with resistors Rds4 to Rds7, capacitors Cgd4 to Cfd7 and capacitors Cgs4 to Cgs7. Here, the resistors Rds4 to Rds7 are serially connected between the N-type MOS transistor MN2 and the first back-gate-side terminal BG1. The capacitors Cgd4 to Cgd7 are connected between first terminals of the resistors Rds4 to Rds7 and the gate of the N-type MOS transistor MN2, respectively. The capacitors Cgs4 to Cgs7 are connected between second terminals of the resistors Rds4 to Rds7 and the gate of the N-type MOS transistor MN2, respectively.

It would be understood from the equivalent circuit shown in FIG. 11 that the circuit section including the resistors Rds4 to Rds7, the capacitors Cgs4 to Cgs7 and the capacitors Cgd4 to Cgd7 functions as a low pass filter circuit. In FIGS. 10 and 11, the N-type MOS transistor MN2 is placed in the off-state and this is equivalent to an operation in which the load of the low pass filter circuit is a high-impedance element.

Referring to FIG. 11, a description is given of the output circuit 204a according to the first embodiment of the present invention. In the output circuit 204a, a high-frequency signal may be applied so that the source-to-gate voltages of the N-type MOS transistors MN4 to MN7 become positive, and the combined resistances of the N-type MOS transistors MN4 to MN7 range from several hundred kilo-ohms to several mega-ohms. In this case, the cut-off frequency of the low pass filter circuit can be adjusted sufficiently lower than the frequency of the high-frequency signal, even when the capacitances of the parasitic capacitors Cgs4 to Cgs7 and Cgd4 to Cgd7 of the N-type MOS transistors MN4 to MN7 are about several ten femto-farad. Therefore, the leakage signal incoming into the first output circuit 204a from the first back-gate-side terminal BG1 is sufficiently attenuated before reaching the source of the N-type MOS transistor MN2. As a result, the N-type MOS transistor MN2 is free from changes in the source-to-gate voltage and kept in the off-state; this effectively solves the problem of the leakage current of the driver circuit 201.

Figure 6:
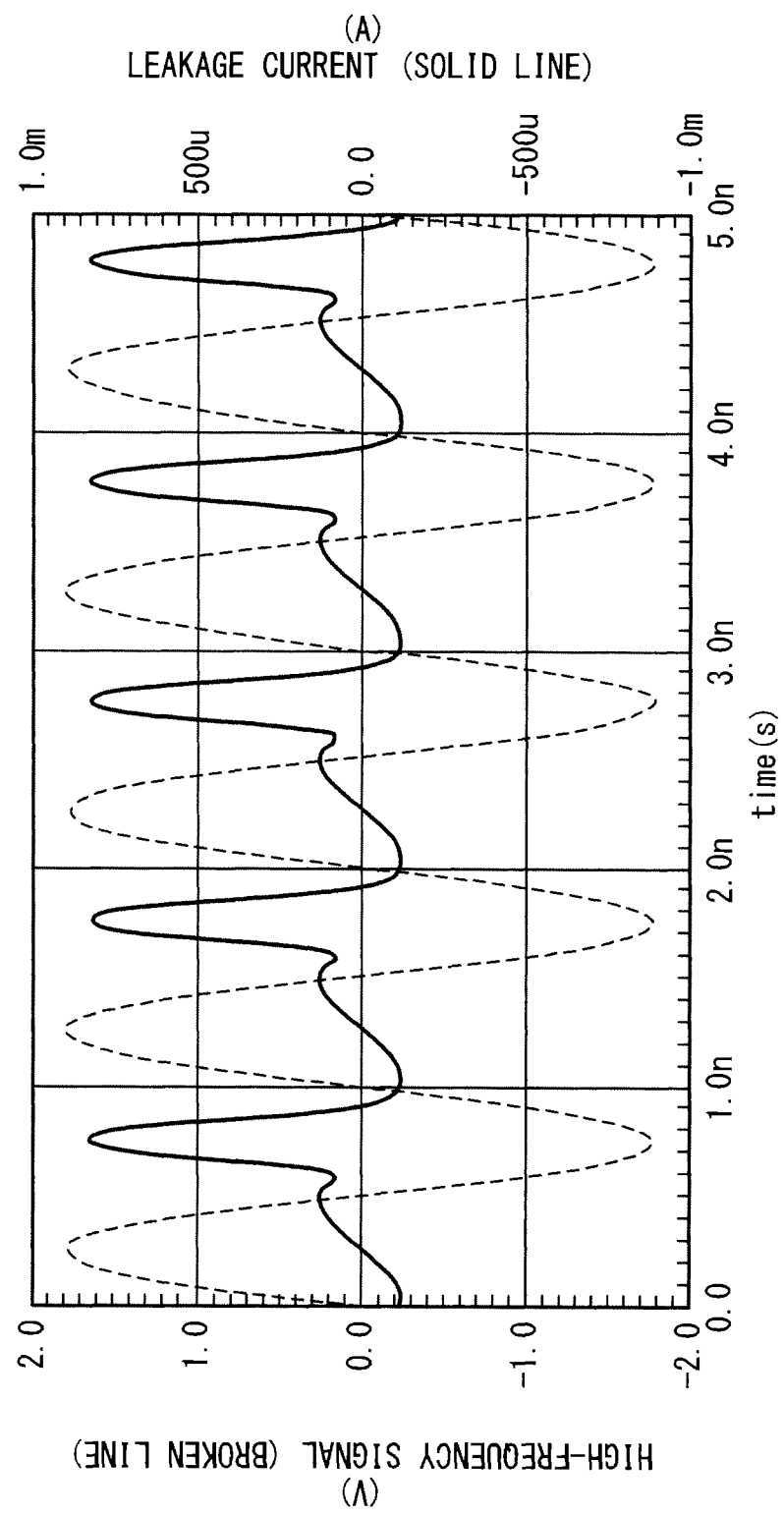
FIG. 6 is a waveform diagram showing the waveform of the leakage current through the output circuit shown in FIG. 3 caused by superposition of a high-frequency signal.
Figure 7:
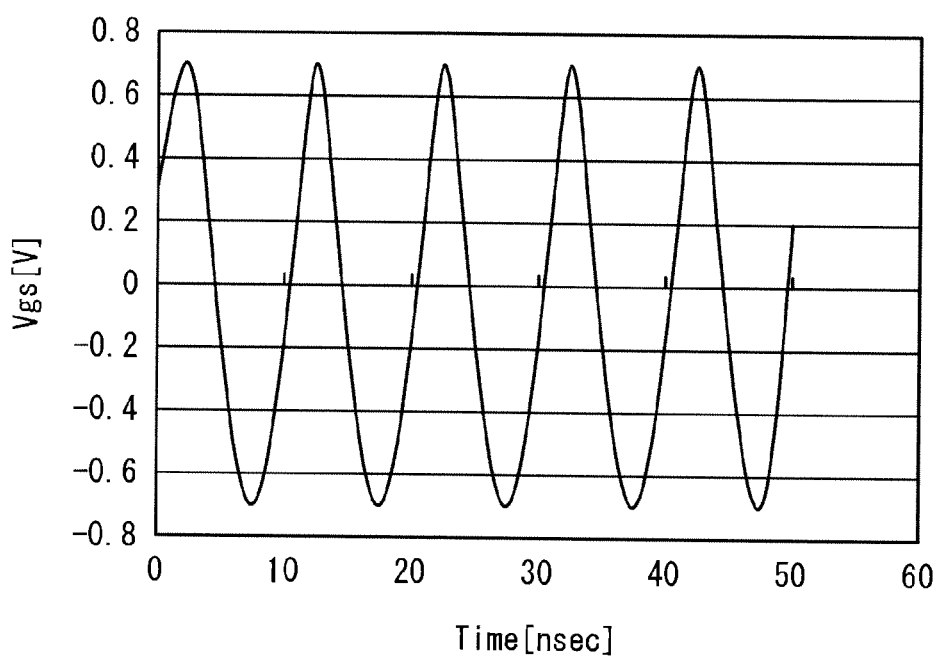
FIG. 7 is a waveform diagram showing the gate-to-source voltage of the N-type MOS transistor MN2 in the circuit shown in FIG. 3 for a case when a large-amplitude signal is fed to the antenna terminal.
Figure 12:
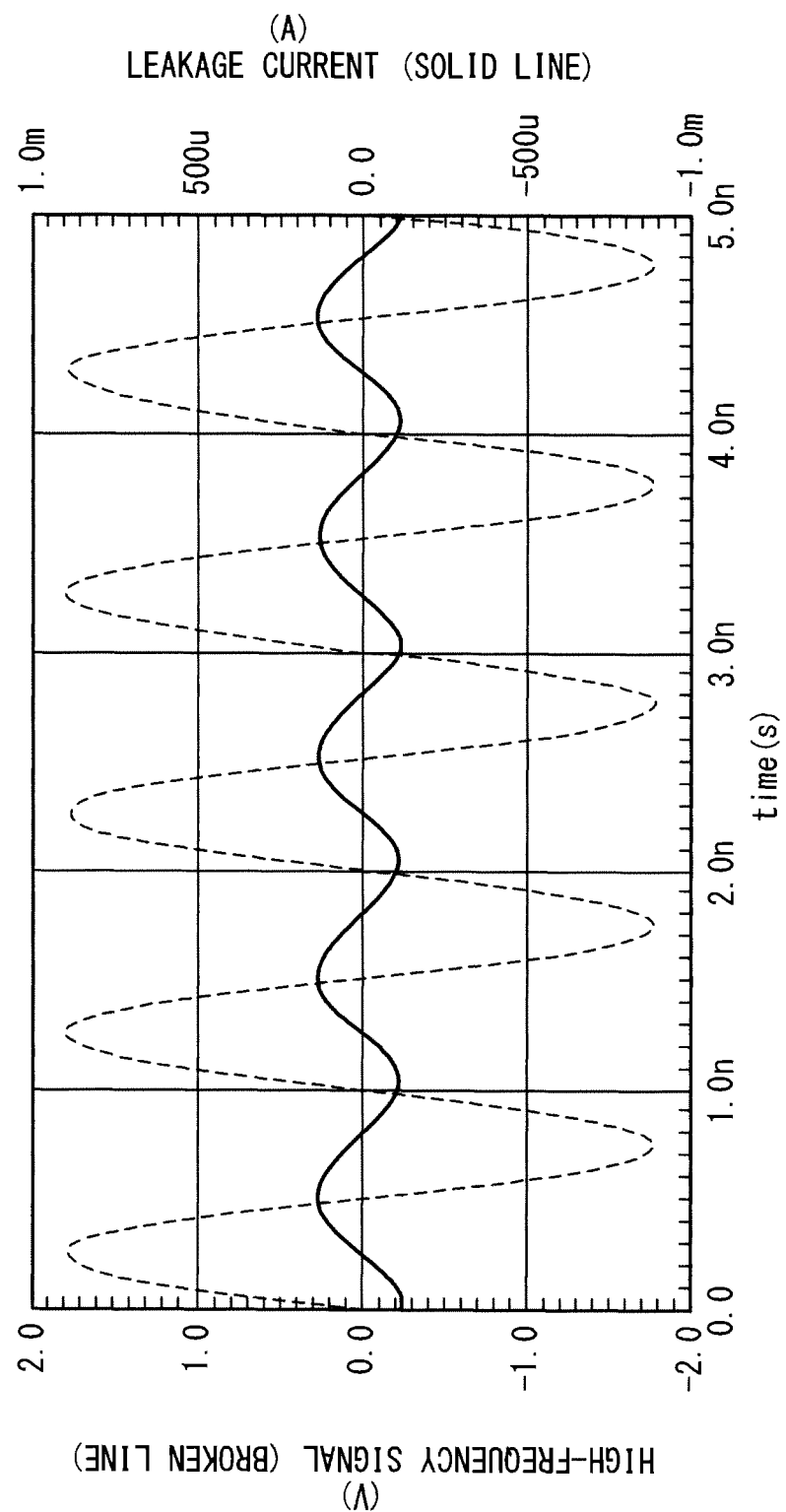
FIG. 12 is a waveform diagram showing the waveform of a leakage current through the output circuit according to the first embodiment of the present invention, the leakage current being caused by superposition of a high-frequency signal.

FIG. 12 is a waveform diagram showing the waveform of the leakage current caused by the superposition of the high-frequency signal through the output circuit according to the first embodiment of the present invention. In the waveform diagram of FIG. 12, the broken line indicates the time-dependent changes in the high-frequency signal and the solid line indicates the time-dependent changes in the leakage current. It would be understood from a comparison of the waveform diagram shown in FIG. 12 with that shown in FIG. 6 for the circuit configuration which incorporates no low pass filter, that the leakage current is significantly reduced in the first embodiment of the present invention.

Figure 3:
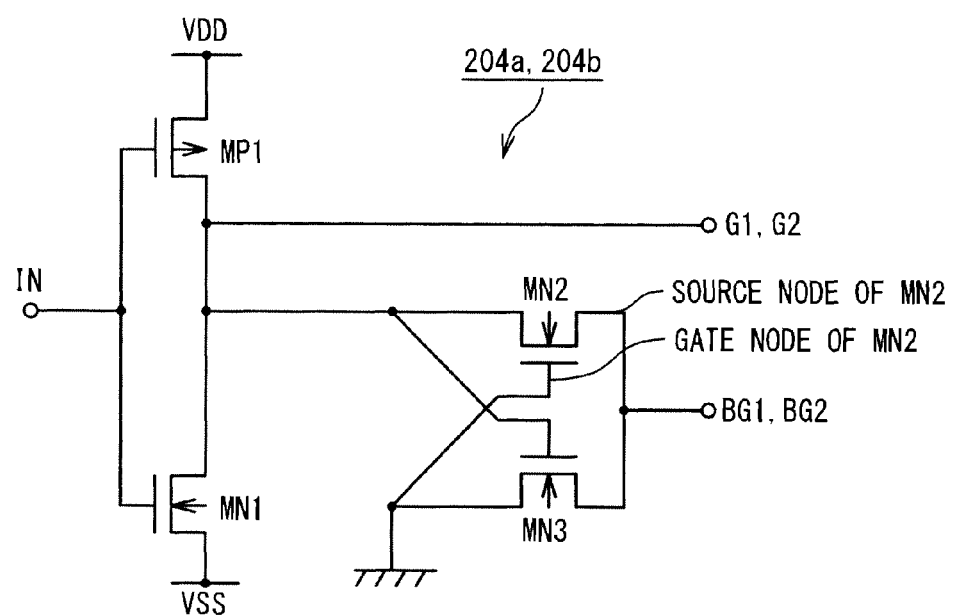
FIG. 3 is a circuit diagram schematically showing the configuration of the output circuits of the first and second driver circuits, shown in FIG. 2.
Figure 4:
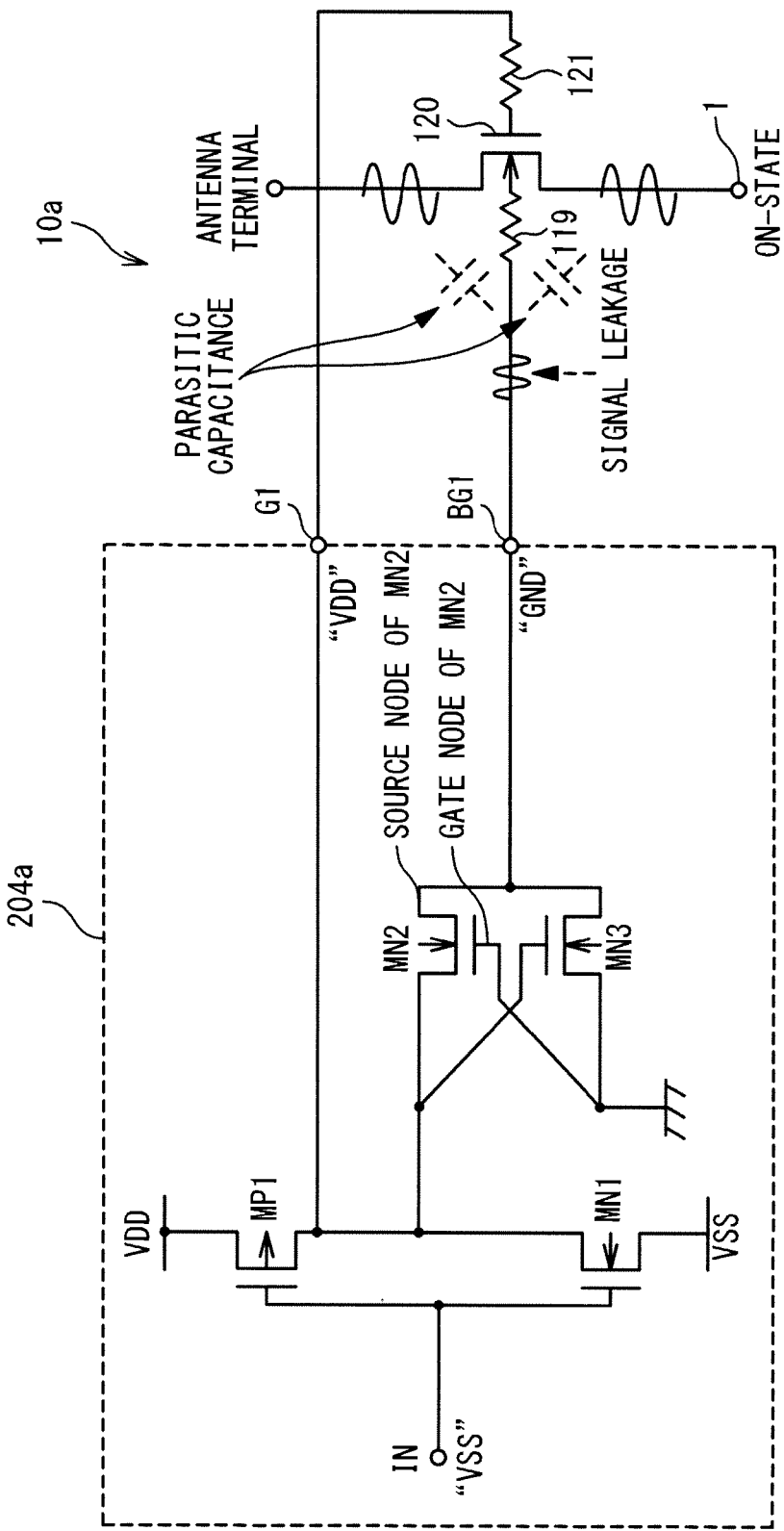
FIG. 4 is a circuit diagram showing an equivalent circuit of the switch circuitry and the output circuit and shown in FIGS. 1 and 3.
Figure 5:
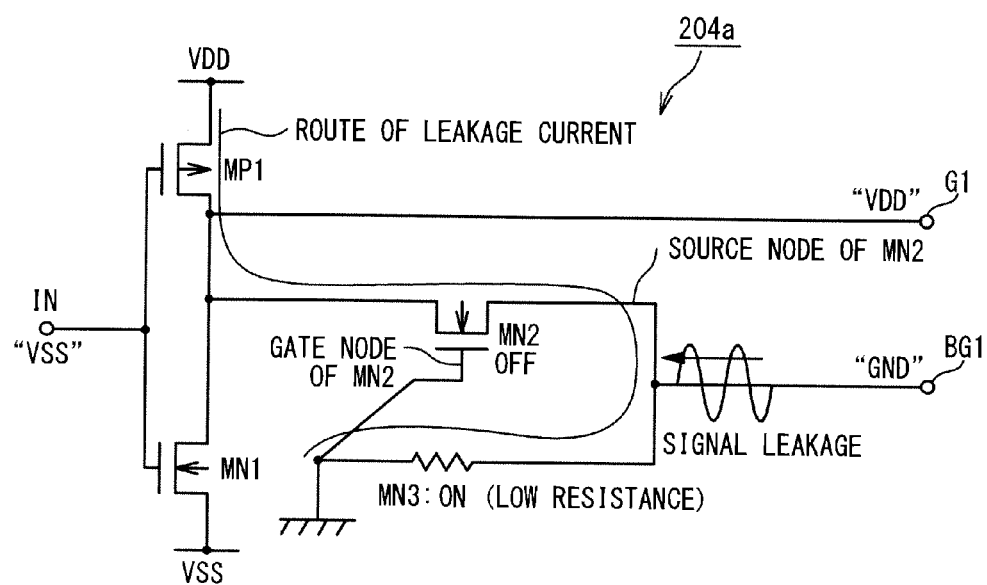
FIG. 5 is a circuit diagram showing an equivalent circuit of the output circuit shown in FIG. 3 and the route of the leakage current.
Figure 13:
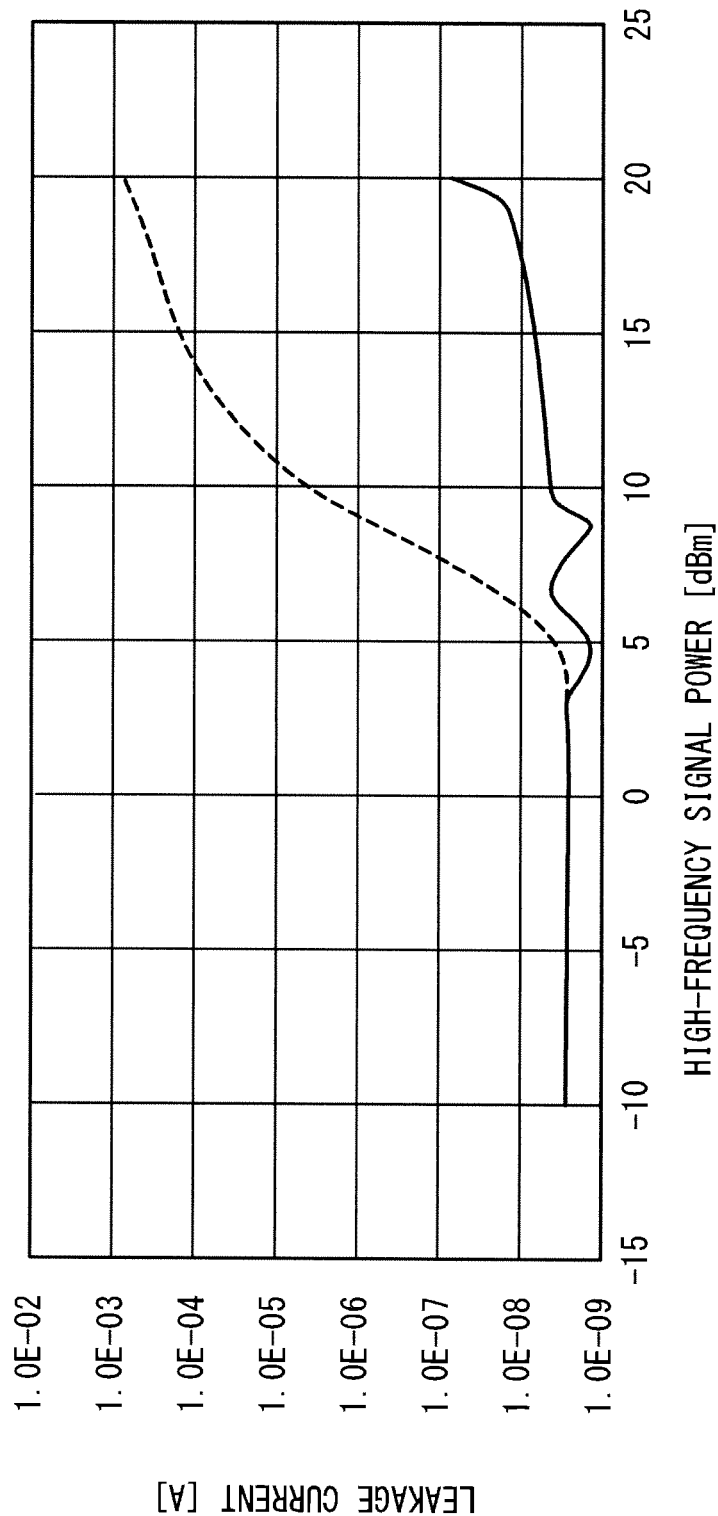
FIG. 13 is a graph showing a comparison of changes in the leakage current levels against the level of the high-frequency signal applied to the first output circuit between the circuit configuration shown in FIG. 10 according to the first embodiment of the present invention and that shown in FIG. 3.

FIG. 13 is a graph showing a comparison of changes in the leakage current levels against the level of the high-frequency signal applied to the first output circuit 204a between the output circuit 204a according to the first embodiment of the present invention and that shown in FIG. 3. In the graph shown in FIG. 13, the horizontal axis represents the power of the high-frequency signal and the vertical axis represents the level of the leakage current. The broken line indicates the leakage current flowing through the output circuit shown in FIG. 3, and the solid line indicates that through the output circuit according to the first embodiment of the present invention.

It would be understood from the graph shown in FIG. 13 that the use of the switch circuit device according to the first embodiment of the present invention effectively reduces the leakage current by 10 dB or more which is calculated as the input level on the output of the driver circuit 201, compared to the case when the output circuit shown in FIG. 3 is used. As thus described, the use of the switch circuit device according to the first embodiment of the present invention effectively improves the switch circuit characteristics and reduces the current consumption.

Second Embodiment

Figure 14:
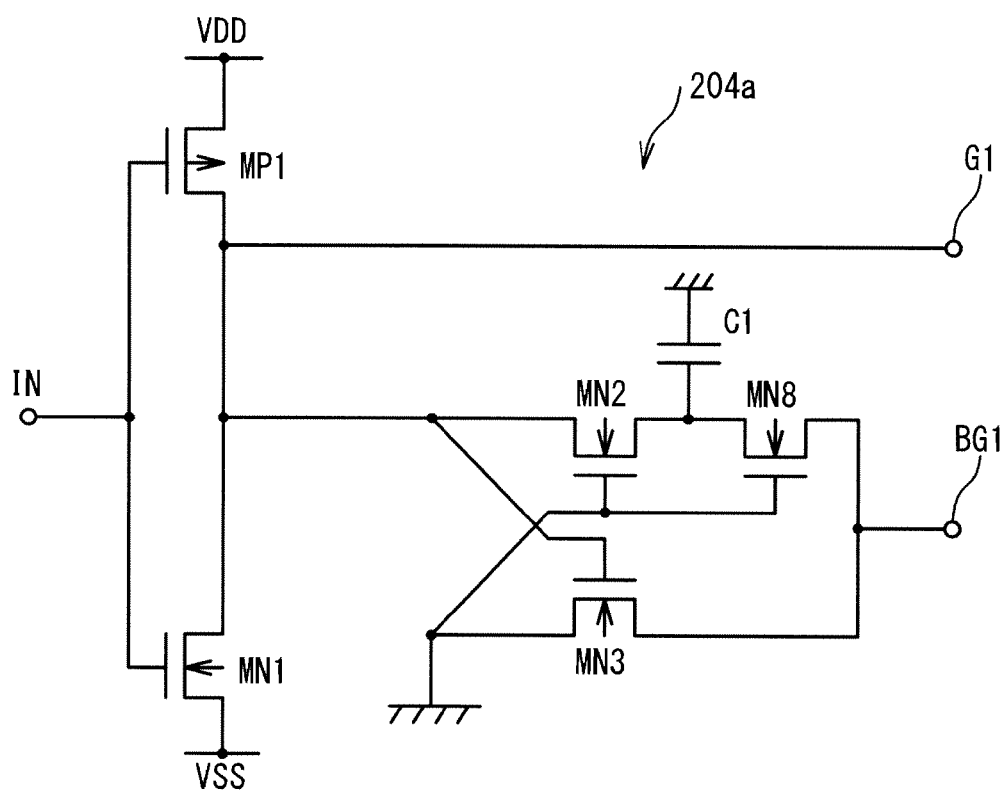
FIG. 14 is a circuit diagram showing an exemplary configuration of a first output circuit incorporated in a switch circuit device according to a second embodiment of the present invention.

FIG. 14 is a circuit diagram showing an exemplary configuration of the first output circuit 204a of the switch circuit device according to the second embodiment of the present invention. It should be noted that, in the second embodiment of the present invention, the configuration of the second output circuit 204b is same as that of the first output circuit 204a, and the configurations of the other circuit components are same as those in the first embodiment.

Referring to FIG. 14, a description is given of an exemplary configuration of the first output circuit 204a according to the second embodiment of the present invention. The first output circuit 204a shown in FIG. 14 is obtained by modifying the first output circuit 204a shown in FIG. 10 as follows: The N-type MOS transistor MN4 to Mn7 are replaced with an N-type MOS transistor MN8 and a capacitor C1. Here, the source of the N-type MOS transistor MN2 is connected to one terminal of the capacitor C1 and the drain of the N-type MOS transistor MN8. The other terminal of the capacitor C1 is connected to the ground. The gate of the N-type MOS transistor MN8 is connected to the gate of the N-type MOS transistor MN2 and the ground. The source of the N-type MOS transistor MN8 is connected to the first back-gate-side terminal BG1.

Figure 15:
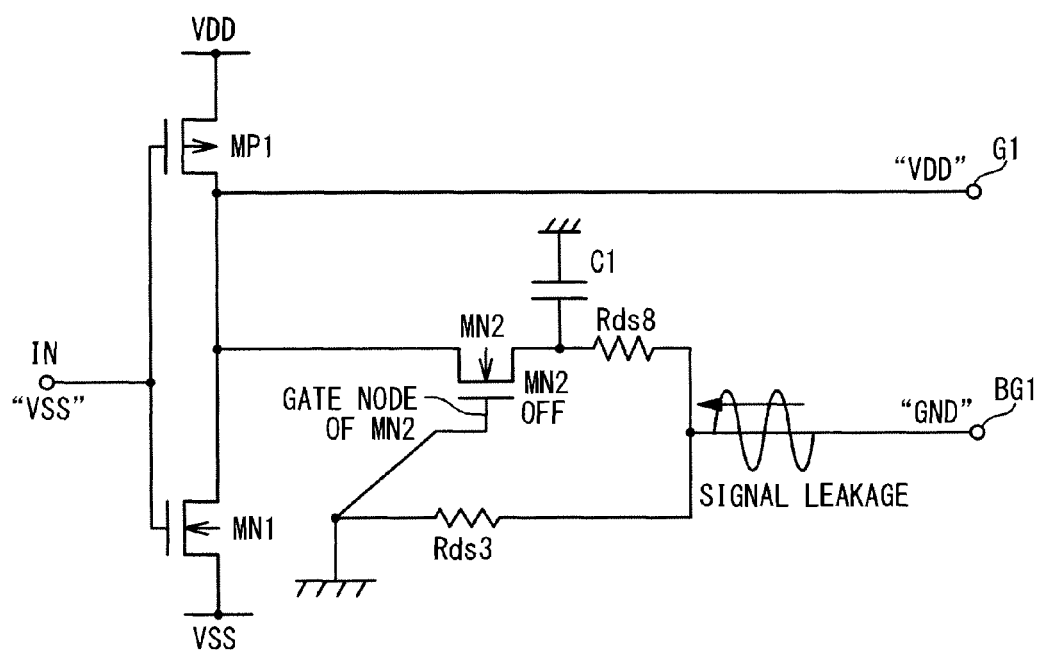
FIG. 15 is a circuit diagram showing an equivalent circuit of the circuit shown in FIG. 14.

FIG. 15 is a circuit diagram showing the equivalent circuit of the output circuit 204a shown in FIG. 14. As shown in FIG. 15, the N-type MOS transistors MN3 and MN8 shown in FIG. 14 are each equivalent to a resistor disposed between the source and drain thereof, when the negative power supply voltage VSS is inputted to the input IN.

Therefore, as shown in FIG. 15, the equivalent circuit of the output circuit shown in FIG. 14 is obtained by modifying the output circuit shown in FIG. 14 as follows: The N-type MOS transistor MN8 is replaced with a resistor Rds3 connected between the ground and the first back-gate-side terminal BG1. The N-type MOS transistor MN8 is replaced with a resistor Rds8 connected between the source of the N-type transistor MN2 and the first back-gate-side terminal BG1.

As is understood from the equivalent circuit shown in FIG. 15, the circuit section including the capacitor C1 and the N-type MOS transistor MN8 functions as a low pass filter.

The switch circuit device according to the second embodiment of the present invention operates similarly to the switch circuit device according to the first embodiment, and offers the same advantage.

In addition, the switch circuit device according to the second embodiment effectively reduces the circuit size compared to that according to the second embodiment. This is because the capacitor C1 only requires a capacitance of about 1 pF for sufficiently reducing the cutoff frequency of the low pass filter circuit compared to the frequency of the high-frequency signal, and an intrinsic capacitor element offers a larger capacitance per unit area than that of the parasitic capacitance of an N-type MOS transistor.

Third Embodiment

Figure 16:
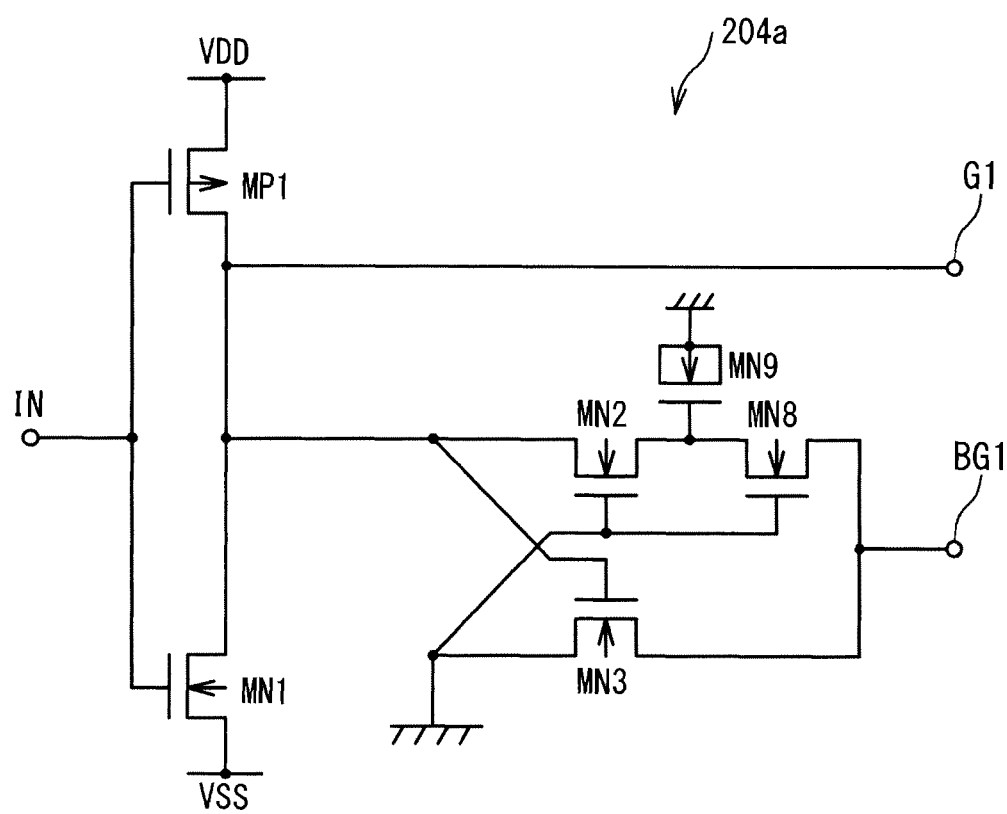
FIG. 16 is a circuit diagram showing an exemplary configuration of a first output circuit incorporated in a switch circuit device according to a third embodiment of the present invention.

FIG. 16 is a circuit diagram showing an exemplary configuration of the first output circuit 204a in the switch circuit device according to the third embodiment of the present invention. It should be noted that, in the third embodiment of the present invention, the configuration of the second output circuit 204b is same as that of the first output circuit 204a, and the configurations of the other circuit components are same as those in the second embodiment.

Referring to FIG. 16, a description is given of an exemplary configuration of the first output circuit 204a according to the third embodiment. The first output circuit 204a shown in FIG. 16 is obtained by modifying the output circuit 204a shown in FIG. 14 as follows: The capacitor C1 is replaced with an N-type MOS transistor MN9. Here, the gate of the N-type MOS transistor MN9 is connected to the source of the N-type MOS transistor MN2 and the drain of the N-type MOS transistor MN8. The source and drain of the N-type MOS transistor MN9 are connected to the ground.

The switch circuit device according to the third embodiment of the present invention operates similarly to the switch circuit device according to the first embodiment, and offers the same advantage.

In addition, the switch circuit device according to the third embodiment effectively achieves the cut-off frequency same as that according to the first embodiment with a reduced circuit size. This is because the capacitance between the gate and the substrate of the N-type MOS transistor MN9 is used in place of the parasitic capacitances of multiple N-type transistors. Also, the circuit configuration according to third embodiment, which incorporates no capacitor element differently from the second embodiment, allows omitting manufacture processes of capacitor elements.

Fourth Embodiment

Figure 17:
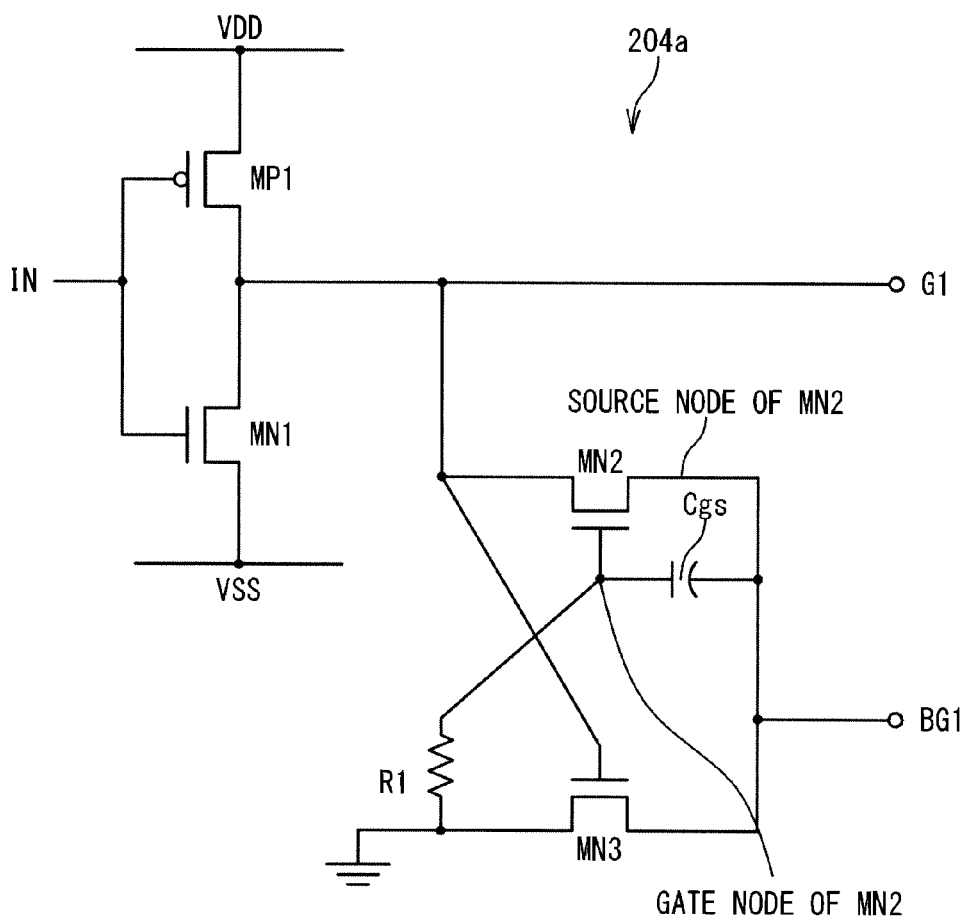
FIG. 17 is a circuit diagram showing an exemplary configuration of a first output circuit incorporated in a switch circuit device according to fourth embodiment of the present invention.

FIG. 17 is a circuit diagram showing an exemplary configuration of the first output circuit 204a in the switch circuit device according to the fourth embodiment of the present invention. It should be noted that, in the fourth embodiment of the present invention, the configuration of the second output circuit 204b is same as that of the first output circuit 204a. The first output circuit 204a includes an inverter circuit, an N-latch circuit, and a high pass filter circuit.

Referring to FIG. 17, a description is given of the components of the first output circuit 204a. The inverter circuit includes a P-type MOS transistor MP1 and an N-type MOS transistor MN1. The N-latch circuit includes two N-type MOS transistors MN2 and MN3. It should be noted that the N-type MOS transistor MN2 incorporates a gate-to-source parasitic capacitance Cgs. The high pass filter includes a resistor element R1 and the parasitic capacitance Cgs.

Referring to FIG. 17, a description is given of connections among the components of the first output circuit 204a. The input IN of the output circuit 204a is connected to the gates of the P-type MOS transistor MP1 and the N-type MOS transistor MN1. The source of the P-type MOS transistor MP1 is connected to the supply line of the positive voltage VDD. The drain of the P-type MOS transistor MP1 is connected to the first gate-side terminal G1, the drain of the N-type MOS transistor MN1, the drain of the N-type MOS transistor MN2 and the gate of the N-type MOS transistor MN3. The source of the N-type MOS transistor MN1 is connected to the supply line of the negative voltage VSS. The gate of the N-type MOS transistor MN2 is connected to one terminal of the resistor element R1. The other terminal of the resistor element R1 is connected to the ground and the drain of the N-type MOS transistor MN3. The source of the N-type MOS transistor Mn2 is connected the back-gate-side terminal BG1 and the source of the N-type MOS transistor MN3.

It should be noted that the source and drain may be exchanged in each of the P-type MOS transistor MP1 and the N-type MOS transistor MN1 to MN3.

Referring to FIG. 17, a description is given of the operation of the first output circuit 204a according to the fourth embodiment. It should be noted that the operation of the second output circuit 204b is same as that of the first output circuit 204a. In this embodiment, the impedance between the gate of the N-type MOS transistor MN2 and the ground is increased by additionally providing the resistor element R1 which is connected to the gate of the N-type MOS transistor MN2. Accordingly, the gate of the N-type MOS transistor MN2 and the back-gate-side terminal BG1 are short-circuited via the parasitic capacitance Cgs of the N-type MOS transistor MN2 in a high-frequency band. As thus described, the resistor element R1 and the parasitic capacitor Cgs operate as a high pass filter.

When a large-amplitude signal is inputted to the antenna terminal, the gate-to-source voltage $V_{GS}$ of the N-type MOS transistor MN2 is kept zero by short-circuiting the gate of the N-type MOS transistor MN2 and the first back-gate-side terminal BG1 in the high-frequency band. As a result, the N-type MOS transistor MN2 is kept in the off-state and no current flows between the drain and source thereof.

Figure 8:
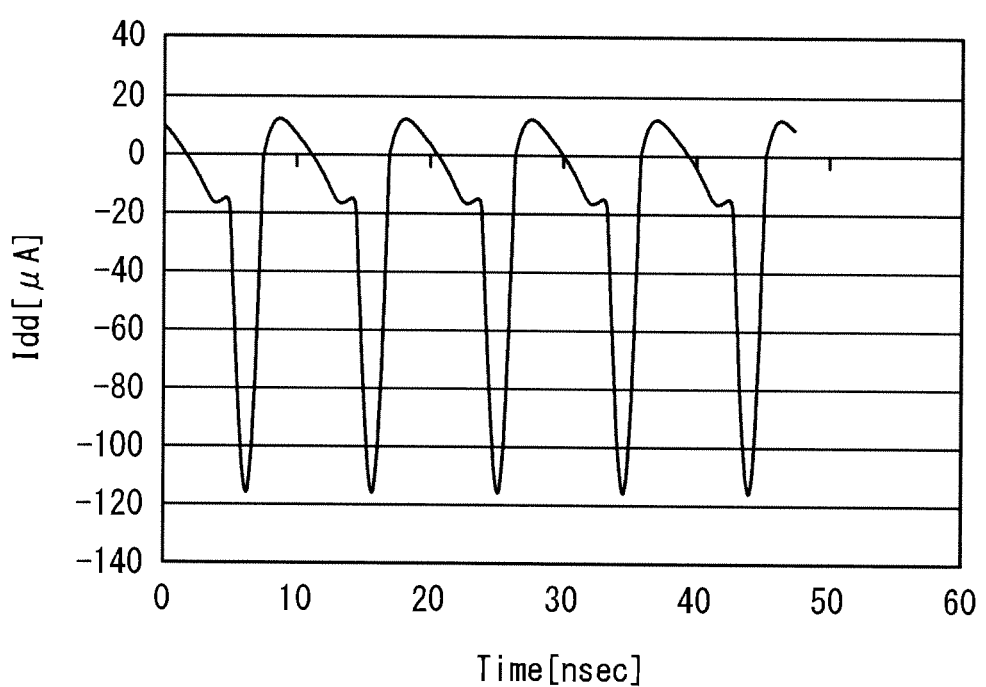
FIG. 8 is a waveform diagram showing the current through the N-type MOS transistor MN2 in the circuit shown in FIG. 3 for a case when a large-amplitude signal is inputted to the antenna terminal.
Figure 9:
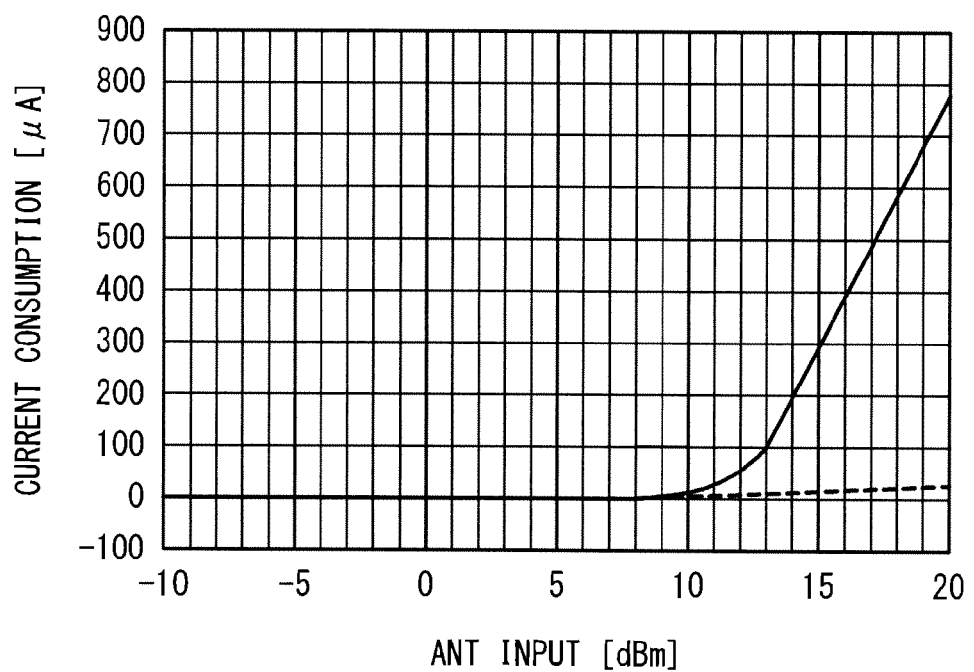
FIG. 9 is a waveform diagram showing a comparison of the results of numerical simulations of the relation between the input signal power into the antenna terminal and the current consumption in the output circuit shown in FIG. 3 and the circuit according to one embodiment of the present invention.

FIG. 9 is a waveform diagram showing a comparison of the results of numerical simulations of the relation between the input signal power into the antenna terminal and the current consumption in the output circuit shown in FIG. 3 and the circuit according to this embodiment. In FIG. 8, the horizontal axis represents the input signal power into the antenna terminal and the vertical axis represents the current consumption of the circuit. The solid line indicates the current consumption of the output circuit shown in FIG. 3 and the broken line indicated that of the output circuit 204a according to the fourth embodiment. As is understood from FIG. 9, the current consumption of the output circuit 204a, which originally increases as the increase in the input signal power into the antenna terminal, is effectively reduced by 10 dB in this embodiment, compared to that of the output circuit shown in FIG. 3.

Fifth Embodiment

Figure 18:
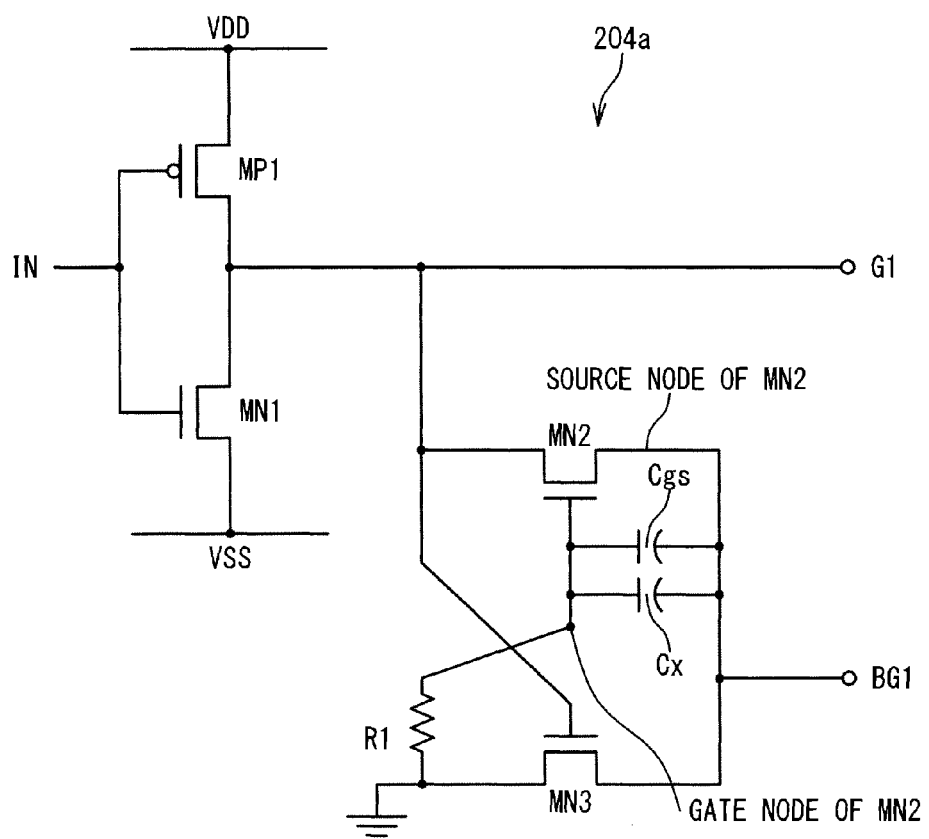
FIG. 18 is a circuit diagram showing an exemplary configuration of a first output circuit incorporated in a switch circuit device according to fifth embodiment of the present invention.

FIG. 18 is a circuit diagram showing an exemplary configuration of the output circuit 204a according to a fifth embodiment of the present invention. It should be noted that, in the fifth embodiment of the present invention, the configuration of the second output circuit 204b is same as that of the first output circuit 204a. The first output circuit 204a shown in FIG. 18 is obtained by additionally providing a capacitor element Cx connected in parallel to the parasitic capacitor Cgs within the output circuit 204a shown in FIG. 17. The configurations of the other circuit components according to the present embodiment are same as those in the fourth embodiment. In the fifth embodiment, the resistor element R1, the parasitic capacitor Cgs and the capacitor element Cx operate as a high pass filter circuit. This allows independently adjusting the characteristics of the N-latch circuit and the high pass filter circuit.

A comparison between the fourth and fifth embodiments of the present invention is given in the following. In the fourth embodiment, the cut-off frequency fc of the high pass filter circuit is expressed by the following expression:

$$fc = 1/(2\pi \times R1 \times Cgs).$$

This implies that the cut-off frequency fc is controllable by adjusting the resistance of the resistor element R1 and the capacitance of the parasitic capacitor Cgs. It is, however, necessary to increase the size of the N-type MOS transistor MN2 in order to increase the capacitance of the parasitic capacitor Cgs. The increase in the size of the N-type MOS transistor MN2, however, undesirably increases the leakage current through the output circuit 204a. This implies that this approach is not efficient as a whole of the output circuit 204a. Therefore, it is necessary to increase the resistance of the resistor element R1, in order to increase the cut-off frequency fc. When the cut-off frequency is set to 10 MHz and the capacitance of the parasitic capacitor Cgs is 10 fF, for example, the required resistance of the resistor element R1 is 1.6 MΩ. Nevertheless, a resistor element having a resistance of 1.6 MΩ may occupy a large area, depending on the semiconductor process in the actual implementation.

In this embodiment, a flexibility of the design of the output circuit 204a is improved by adding the capacitor element Cx to the high pass filter circuit. For example, use of the capacitor element Cx of 1 pF results in that the required resistance of the resistor element R1 for a cut-off frequency of 10 MHz is 16 kΩ; this implies that the use of the capacitor element Cx allows reduction in the circuit size compared to the configuration according to the fourth embodiment.

Sixth Embodiment

Figure 19:
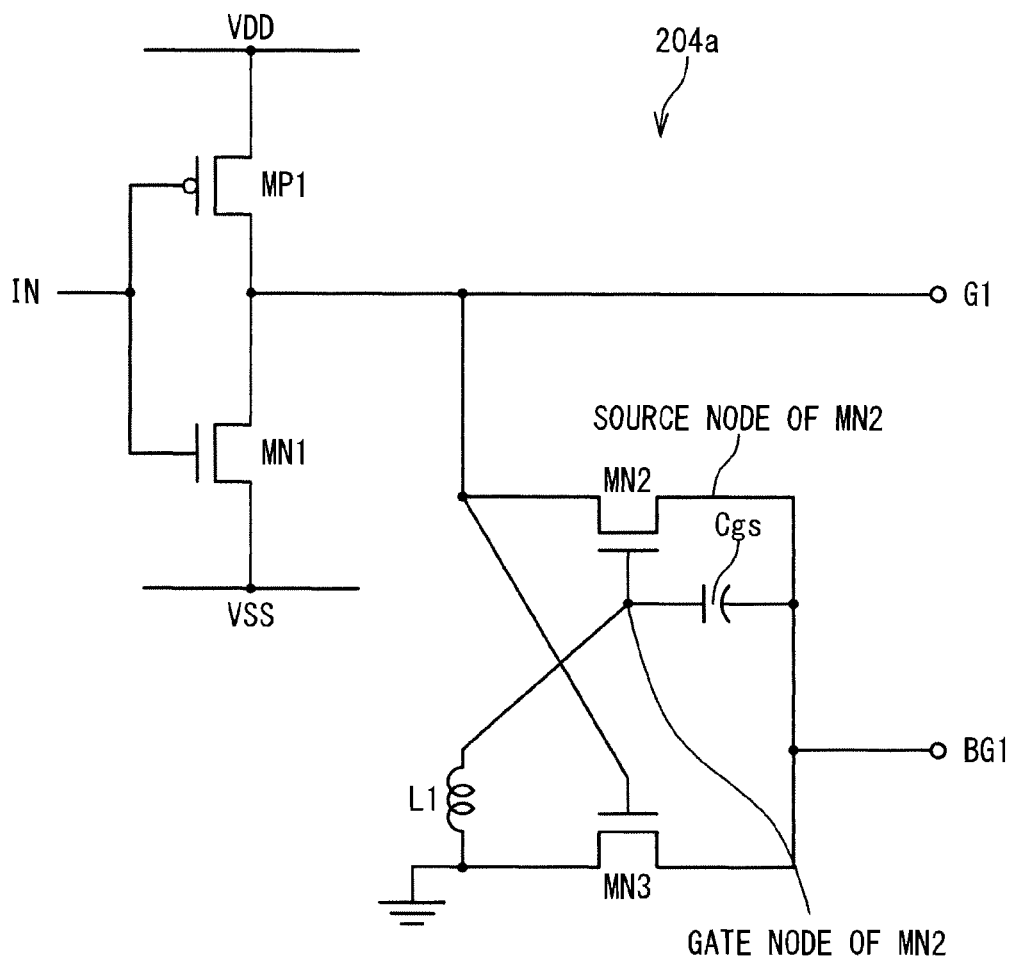
FIG. 19 is a circuit diagram showing an exemplary configuration of a first output circuit incorporated in a switch circuit device according to sixth embodiment of the present invention.

FIG. 19 is a circuit diagram showing an exemplary configuration of a first output circuit 204a according to a sixth embodiment of the present invention. It should be noted that, in the sixth embodiment of the present invention, the configuration of the second output circuit 204b is same as that of the first output circuit 204a. The output circuit 204a shown in FIG. 19 is obtained by replacing the resistor element R1 of the output circuit 204a shown in FIG. 17 with an inductance element L1. In the six embodiment of the present invention, the inductance element L1 and the parasitic capacitor Cgs operate as a high pass filter circuit. The configurations of the other circuit components according to the present embodiment are same as those in the fourth embodiment.

As discussed above, the output circuits according to the fourth to sixth embodiments achieve reductions in the circuit size and the power consumption at the same time, effectively improving the competitiveness of the products.

It should be noted that the output circuits according to the first to sixth embodiments normally operate if the polarities of the power supply voltages and the conductivity types of the MOS transistors are appropriately inverted. It should be also noted that the term "terminal" in the above does not mean that the "terminal" is required to be structured as being connectable to an external component.

It should be also noted that the configurations of the output circuits according to the first to sixth embodiments may be combined as long as it cause no technical inconsistency.

What is claimed is:

1. A switch circuit device, comprising:
  a switch circuitry switching an electrical connection between first and second terminals between an on-state and an off-state in response to a set of control signals; and
  a driver circuitry generating said set of control signals,
  wherein said driver circuitry includes:
    an N-latch circuit outputting lower one of two input voltages as one of said set of control signals; and
    a leakage current suppression circuit, which includes a low pass filter circuit disposed between said switch circuitry and said N-latch circuit to suppress an incoming of a signal from said switch circuitry to said N-latch circuit,
  wherein said switch circuitry includes:
    a set of transistors disposed between said first and second terminals,
  wherein said set of transistors each receive said set of control signals on a gate and a back-gate thereof and are switched between an on-state and an off-state in response to said set of control signals,
  wherein said set of control signals include:
    a gate control signal fed to said gates of said set of MOS transistors; and
    a back-gate control signal fed to said back-gates of said set of MOS transistors,
  wherein said driver circuitry further includes an inverter circuit outputting selected one of first and second input voltages as said gate control signal, and
  wherein said N-latch circuit is connected to an output of said inverter circuit and outputs lower one of said gate control signal or a ground voltage as said back-gate control signal, and includes:
    a first transistor receiving said gate control signal on one of a source or drain thereof and receiving said ground voltage on a gate thereof; and
    a second transistor receiving said ground voltage on one of a source or drain thereof and receiving said gate-control signal on a gate thereof, the other of the source or drain of said second transistor being connected to said switch circuitry,
  wherein said low pass filter circuit includes:
    a plurality of transistors serially connected between the other of the source or drain of said first transistor of said N-latch circuit and said switch circuitry and each having a gate connected to said gate of said first transistor of said N-latch circuit, wherein each transistor of said plurality of transistors has a drain and a source,
  and wherein the drain and source may be exchanged in each of said first transistor, said second transistor, and said plurality of transistors.

2. A switch circuit device, comprising:
  a switch circuitry switching an electrical connection between first and second terminals between an on-state and an off-state in response to a set of control signals; and
  a driver circuitry generating said set of control signals,
  wherein said driver circuitry includes:
    an N-latch circuit outputting lower one of two input voltages as one of said set of control signals; and
    a leakage current suppression circuit suppressing a leakage current through said N-latch circuit, wherein said leakage current suppression circuit includes:
a low pass filter circuit disposed between said switch circuitry and said N-latch circuit to suppress an incoming of a signal from said switch circuit o said N-latch circuit, and
wherein said N-latch circuit includes:
a first transistor receiving said gate control signal on one of a source or drain thereof and receiving said ground voltage on a gate thereof; and
a second transistor receiving said ground voltage on one of a source or drain thereof and receiving said gate-control signal on a gate thereof, the other of the source or drain of said second transistor being connected to said switch circuitry,
wherein said low pass filter circuit includes:
a capacitor having one terminal connected to the other of the source or drain of said first transistor of said N-latch circuit, the other terminal of said capacitor being connected to ground; and
a third transistor having one of a source or drain connected to the other of the source or drain of said first transistor of said N-latch circuit, a gate connected to the gate of said first transistor of said N-latch circuit and the other of the source or drain connected to the switch circuitry,
and wherein the drain and source may be exchanged in each of said first transistor, said second transistor, and said third transistor.

3. A switch circuit device, comprising:
a switch circuitry switching an electrical connection between first and second terminals between an on-state and an off-state in response to a set of control signals; and
a driver circuitry generating said set of control signals,
wherein said driver circuitry includes:
an N-latch circuit outputting lower one of two input voltages as one of said set of control signals; and
a leakage current suppression circuit suppressing a leakage current through said N-latch circuit,
wherein said leakage current suppession circuit includes:
a low pass filter circuit disposed between said switch circuitry and said N-latch circuit to suppress an incoming of a signal from said switch circuitry to said N-latch circuit,
wherein said switch circuitry includes:
a set of transistors disposed between said first and second terminals,
wherein said set of transistors each receive said set of control signals on a gate and a back-gate thereof and are switched between an on-state and an off-state in response to said set of control signals,
wherein said set of control signals include:
a gate control signal fed to said gates of said set of MOS transistors; and
a back-gate control signal fed to said back-gates of said set of MOS transistors, wherein said driver circuitry further includes:
an inverter circuit outputting selected one of first and second input voltages as said gate control signal, and
wherein said N-latch circuit is connected to an output of said inverter circuit and outputs lower one of said gate control signal or a ground voltage as said back-gate control signal, and
wherein said N-latch circuit includes:
a first transistor receiving said gate control signal on one of a source or drain thereof and receiving said ground voltage on a gate thereof; and
a second transistor receiving said ground voltage on one of a source or drain thereof and receiving said gate-control signal on a gate thereof, the other of the source or drain of said second transistor being connected to said switch circuitry,
wherein said low pass filter circuit includes:
a capacitor having one terminal connected to the other of the source or drain of said first transistor of said N-latch circuit, the other terminal of said capacitor being connected to ground; and
a third transistor having one of a source or drain connected to the other of the source or drain of said first transistor of said N-latch circuit, a gate connected to the gate of said first transistor of said N-latch circuit and the other of the source or drain connected to the switch circuitry,
and wherein the drain and source may be exchanged in each of said first transistor, said second transistor, and said third transistor.

4. A switch circuit device, comprising:
a switch circuitry switching an electrical connection between first and second terminals between an on-state and an off-state in response to a set of control signals; and
a driver circuitry generating said set of control signals,
wherein said driver circuitry includes:
an N-latch circuit outputting lower one of two input voltages as one of said set of control signals; and
a leakage current suppression circuit suppression a leakage current through said N-latch circuit,
wherein said leakage current suppression circuit includes:
a low pass filter circuit disposed between said switch circuitry and said N-latch circuit to suppress an incoming of a signal from said switch circuitry to said N-latch circuit, and
wherein said N-latch circuit includes:
a first transistor receiving said gate control signal on of a source or drain thereof and receiving said ground voltage on a gate thereof; and
a second transistor receiving said ground voltage on one of a source or drain thereof and receiving said gate-control signal on a gate thereof, the other of the source or drain of said second transistor being connected to said switch circuitry,
wherein said low pass filter circuit includes:
a third transistor having a gate connected to the other of the source or drain of said first transistor of said N-latch circuit, wherein said third transistor has a source and a drain; and
a fourth transistor having one of a source or drain connected to the other of the source or drain of said first transistor of said N-latch circuit, a gate connected to said gate of said first transistor of said N-latch circuit and the other of the source or drain connected to the switch circuitry, and wherein the drain and source may be exchanged in each of said first transistor, said second transistor, said third transistor, and said fourth transistor.

5. A switch circuit device, comprising:
a switch circuitry switching an electrical connection between first and second terminals between an on-state and an off-state in response to a set of control signals; and
a driver circuitry generating said set of control signals,
wherein said driver circuitry includes:
an N-latch circuit outputting lower one of two input voltages as one of said set of control signals; and a leakage current suppression circuit suppressing a leakage current through said N-latch circuit,
wherein said leakage current suppression circuit includes:
a low pass filter circuit disposed between said switch circuitry and said N-latch circuit to suppress an incoming of a signal from said switch circuitry to said N-latch circuit,
wherein said switch circuitry includes:
a set of transistors disposed between said first and second terminals,
wherein said set of transistors each receive said set of control signals on a gate and a back-gate thereof and are switched between an on-state and an off-state in response to said set of control signals,
wherein said set of control signals include:
a gate control signal fed to said gates of said set of MOS transistors; and
a back-sate control signal fed to said back said set of MOS transistors, wherein said driver circuitry further includes:
an inverter circuit outputting selected one of first and second input voltages as said gate control signal, and
wherein said N-latch circuit is connected to an output of said inverter circuit and outputs lower one of said gate control signal or a ground voltage as said back-gate control signal, and
wherein said N-latch circuit includes:
a first transistor receiving said gate control signal on one of a source or drain thereof and receiving said ground voltage on a gate thereof; and
a second transistor receiving said ground voltage on one of a source or drain thereof and receiving said gate-control signal on a gate thereof, the other of the source or drain of said second transistor being connected to said switch circuitry,
wherein said low pass filter circuit includes:
a third transistor having a gate connected to the other of the source or drain of said first transistor of said N-latch circuit, wherein said third transistor has a source and a drain; and
a fourth transistor having one of a source or drain connected to the other of the source or drain of said first transistor of said N-latch circuit, a gate connected to said gate of said first transistor of said N-latch circuit and the other of the source or drain connected to the switch circuitry, and wherein the drain and source may be exchanged in each of said first transistor, said second transistor, said third transistor, and said fourth transistor.

6. A switch circuit device, comprising:
a switch circuitry switching an electrical connection between first and second terminals between an on-state and an off-state in response to a set of control signals; and
a driver circuitry generating said set of control signals, wherein said driver circuitry includes:
an N-latch circuit outputting lower one of two input voltages as one of said set of control signals; and
a leakage current suppression circuit suppressing a leakage current through said N-latch circuit;
wherein said leakage current suppression circuitry includes:
a high pass filter circuit suppressing the leakage current through said N-latch circuit by short-circuiting the gate and source of a first transistor in a high-frequency band, where said first transistor is incorporated in said N-latch circuit.

7. The switch circuit device according to claim 6, wherein said switch circuitry includes:
a set of transistors disposed between said first and second terminals,
wherein said set of transistors each receives said set of control signals on a gate and a back-gate thereof and is switched between an on-state and an off-state in response to said set of control signals,
wherein said set of control signals include:
a gate control signal fed to said gates of said set of MOS transistors; and
a back-gate control signal fed to said back-gate of said set of MOS transistors.

8. The switch circuit device according to claim 7, wherein said N-latch circuit includes:
a first transistor receiving said gate control signal on one of a source or drain thereof and receiving said ground voltage on a gate thereof through a resistor element, the other of the source or drain of said first transistor being connected to said switch circuitry; and
a second transistor receiving said ground voltage on one of a source or drain thereof and receiving said gate-control signal on a gate thereof, the other of the source or drain of said second transistor being connected to said switch circuitry,
wherein said high pass filter circuit includes: said resistor element and a parasitic capacitor between said the other of the source or drain of said first transistor and said gate of said first transistor,
and wherein the drain and source may be exchanged in each of said first transistor and said second transistor.

9. The switch circuit device according to claim 7, wherein said N-latch circuit includes:
a first transistor receiving said gate control signal on one of a source or drain thereof and receiving said ground voltage on a gate thereof through a resistor element, the other of the source or drain of said first transistor being connected to said switch circuitry; and
a second transistor receiving said ground voltage on one of a source or drain thereof and receiving said gate-control signal on a gate thereof, the other of the source or drain of said second transistor being connected to said switch circuitry,
wherein said high pass filter circuit includes: said inductance element and a parasitic capacitor between said the other of the source or drain of said first transistor and said gate of said first transistor,
and wherein the drain and source may be exchanged in each of said first transistor and said second transistor.

10. The switch circuit device according to claim 6, wherein said N-latch circuit includes:
a first transistor receiving said gate control signal on one of a source or drain thereof and receiving said ground voltage on a gate thereof through a resistor element, the other of the source or drain of said first transistor being connected to said switch circuitry; and
a second transistor receiving said ground voltage on one of a source or drain thereof and receiving said gate-control signal on a gate thereof, the other of the source or drain of said second transistor being connected to said switch circuitry,
wherein said high pass filter circuit includes: said resistor element and a parasitic capacitor between said the other of the source or drain of said first transistor and said gate of said first transistor,
and wherein the drain and source may be exchanged in said first transistor and said second transistor.

11. The switch circuit device according to claim 10, wherein said high-pass filter circuit further includes a capacitor element connected in parallel to said parasitic capacitor.

12. The switch circuit device according to claim 6, wherein said N-latch circuit includes:
- a first transistor receiving said gate control signal on one of a source or drain thereof and receiving said ground voltage on a gate thereof through a resistor element, the other of the source or drain of said first transistor being connected to said switch circuitry; and
- a second transistor receiving said ground voltage on one of a source or drain thereof and receiving said gate-control signal on a gate thereof, the other of the source or drain of said second transistor being connected to said switch circuitry,
- wherein said high pass filter circuit includes: said inductance element and a parasitic capacitor between said the other of the source or drain of said first transistor and said gate of said first transistor, and wherein the drain and source may be exchanged in each of said first transistor and said second transistor.

13. The switch circuit device according to claim 10, wherein said high-pass filter circuit further includes a capacitor element connected in parallel to said parasitic capacitor.

* * * * *